United States Patent [19]

Asakawa et al.

[11] Patent Number: 5,857,827
[45] Date of Patent: Jan. 12, 1999

[54] CASSETTE CHAMBER

[75] Inventors: Teruo Asakawa; Hiroaki Saeki, both of Yamanashi-ken; Yoji Iizuka, Tokyo; Keiichi Matsushima, Kofu, all of Japan

[73] Assignee: Tokyo Electron Limited, Japan

[21] Appl. No.: 910,057

[22] Filed: Aug. 12, 1997

[30] Foreign Application Priority Data

Aug. 14, 1996 [JP] Japan ..................................... 8-232571
Aug. 30, 1996 [JP] Japan ..................................... 8-248727

[51] Int. Cl.$^6$ ...................................................... B25J 11/00
[52] U.S. Cl. ........................... 414/779; 414/776; 414/940
[58] Field of Search ................................... 414/217, 776, 414/778, 779, 782, 940, 939, 937, 680, 682, 742, 743

[56] References Cited

U.S. PATENT DOCUMENTS

| | | | |
|---|---|---|---|
| 4,859,137 | 8/1989 | Bonora et al. | 414/940 X |
| 5,186,594 | 2/1993 | Toshima et al. | 414/217 |
| 5,443,348 | 8/1995 | Biche et al. | 414/940 X |
| 5,507,614 | 4/1996 | Leonov et al. | 414/940 X |
| 5,588,789 | 12/1996 | Muka et al. | 414/940 X |
| 5,664,926 | 9/1997 | Sussman et al. | 414/940 X |

*Primary Examiner*—Janice L. Krizek
*Attorney, Agent, or Firm*—Graham & James LLP

[57] ABSTRACT

A cassette chamber according to the present invention comprises a housing defining a space stored with a cassette for holding a plurality of objects of treatment, a lift base having a rotatable shaft and located in the housing for up-and-down motion, an auxiliary base fixed to the shaft and inclined at a predetermined angle to the longitudinal direction of the shaft, a cassette support having a bottom support portion set on the lift base and bearing the bottom face of the cassette and a back support portion rotatably supported by the auxiliary base and bearing the back face of the cassette, a rotation mechanism for rotating the shaft as the lift base ascends or descends, thereby rotating the auxiliary base and the cassette support between a first position inside the housing and a second position outside the housing, and a support section for keeping the back support portion of the cassette support parallel to the shaft by engaging the back support portion being rotated to the second position by the rotation mechanism and causing the back support portion to rotate relatively to the auxiliary base.

19 Claims, 17 Drawing Sheets

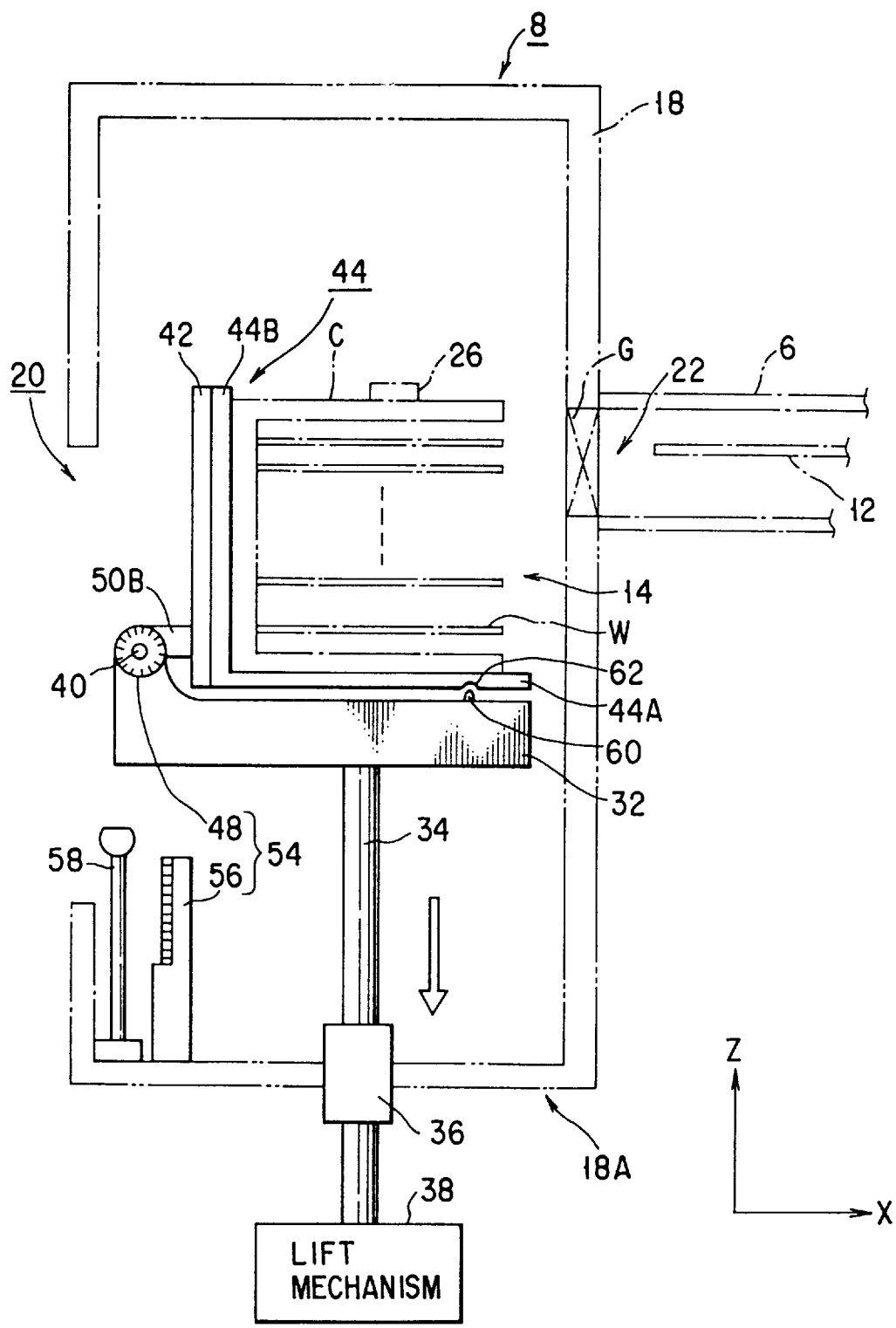
F I G. 1

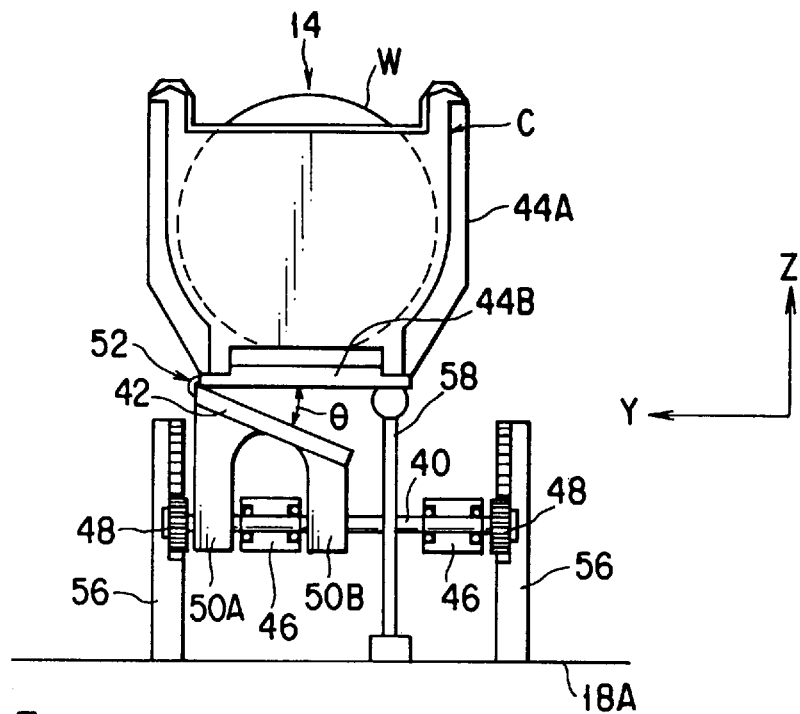
F I G. 5
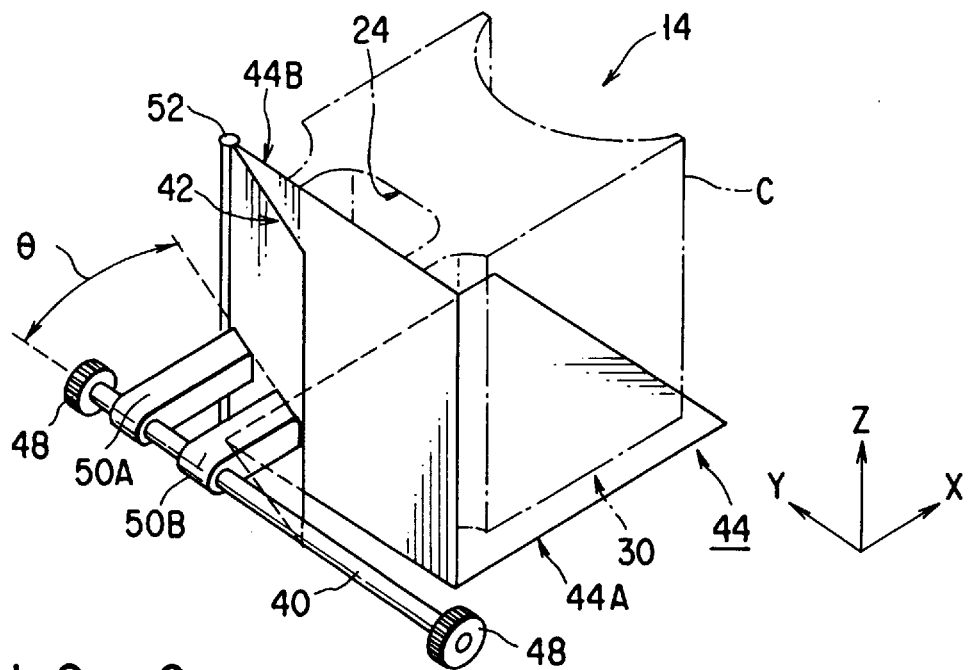
F I G. 6

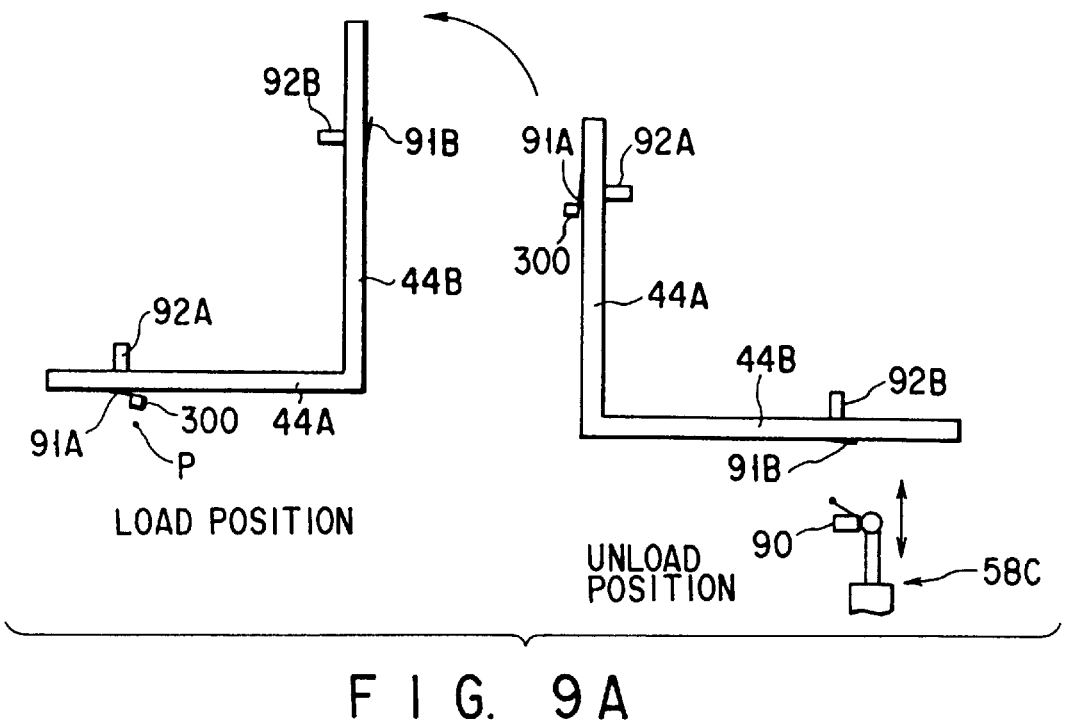
F I G. 9A
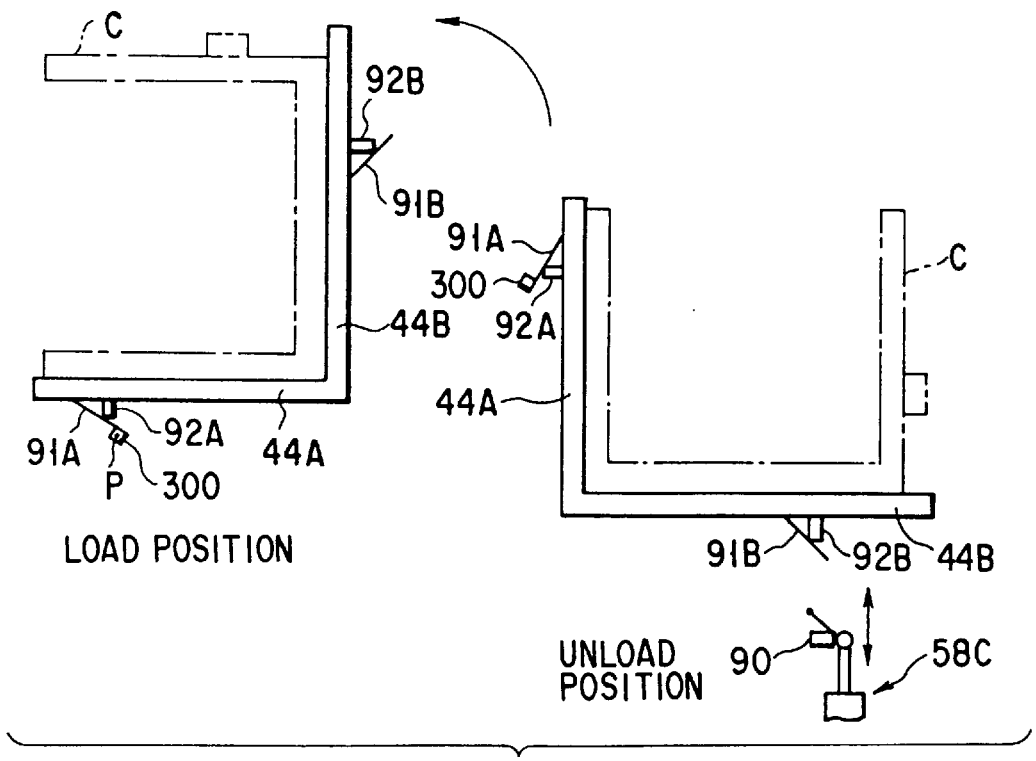
F I G. 9B

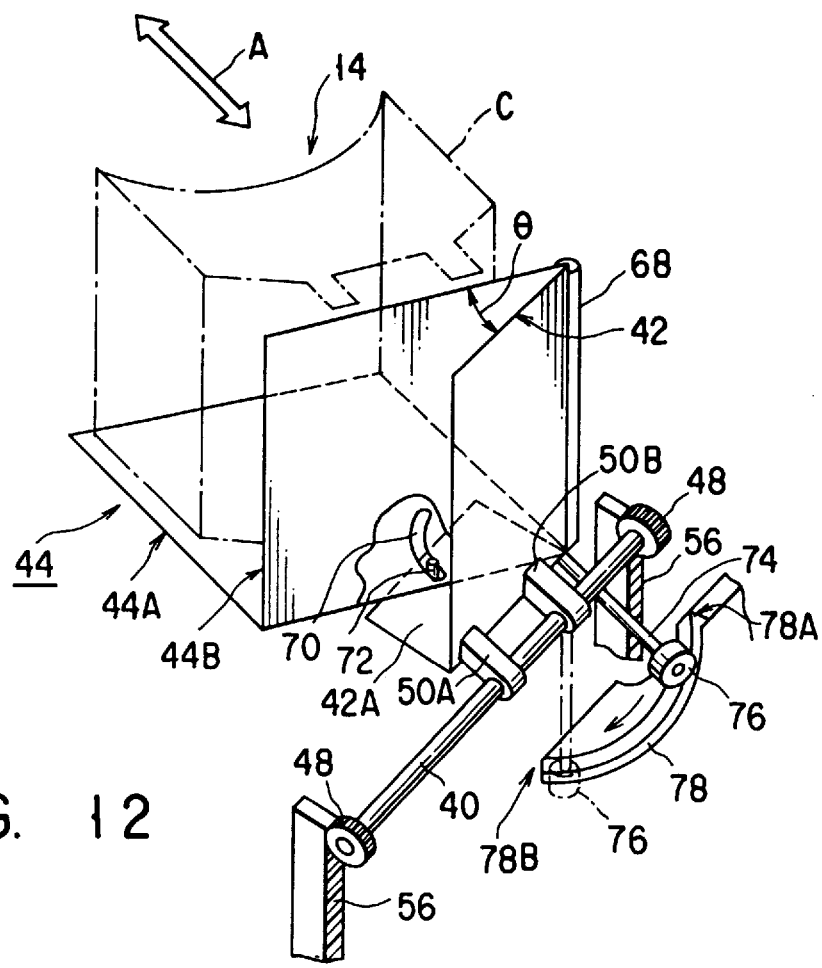
F I G. 12
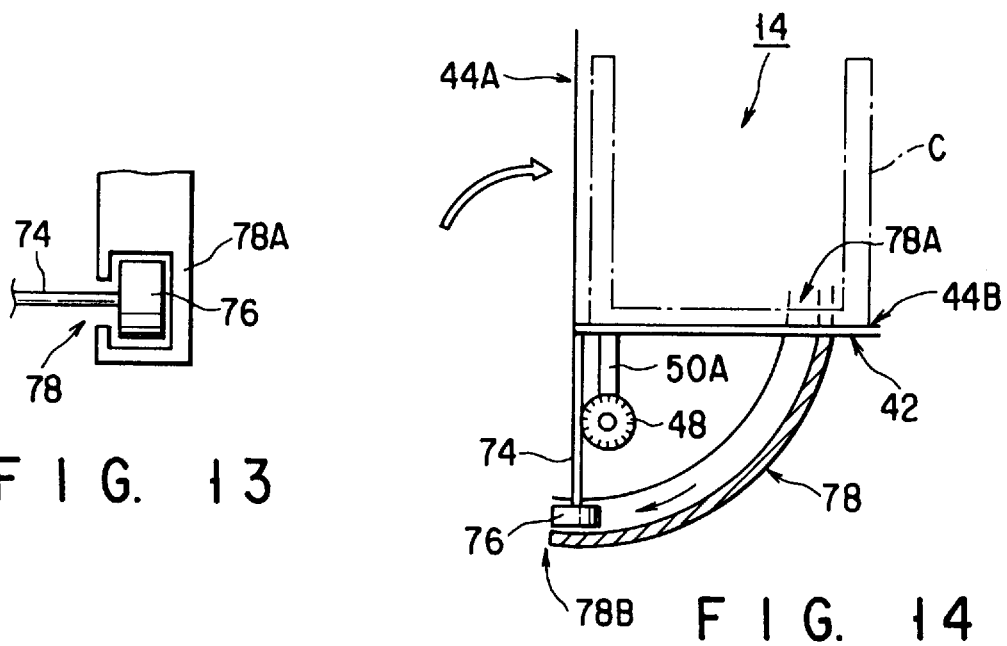
F I G. 13
F I G. 14

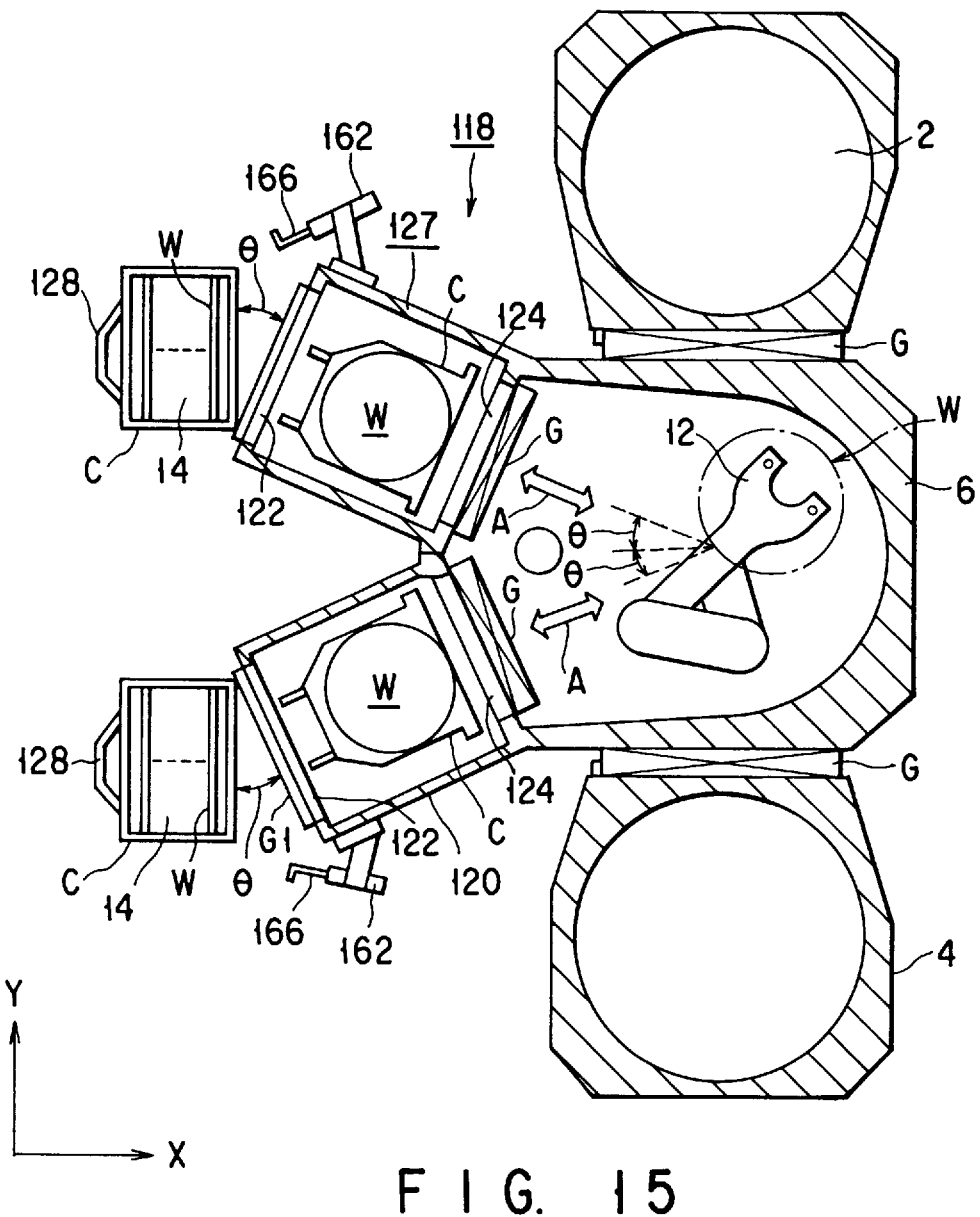
F I G. 15

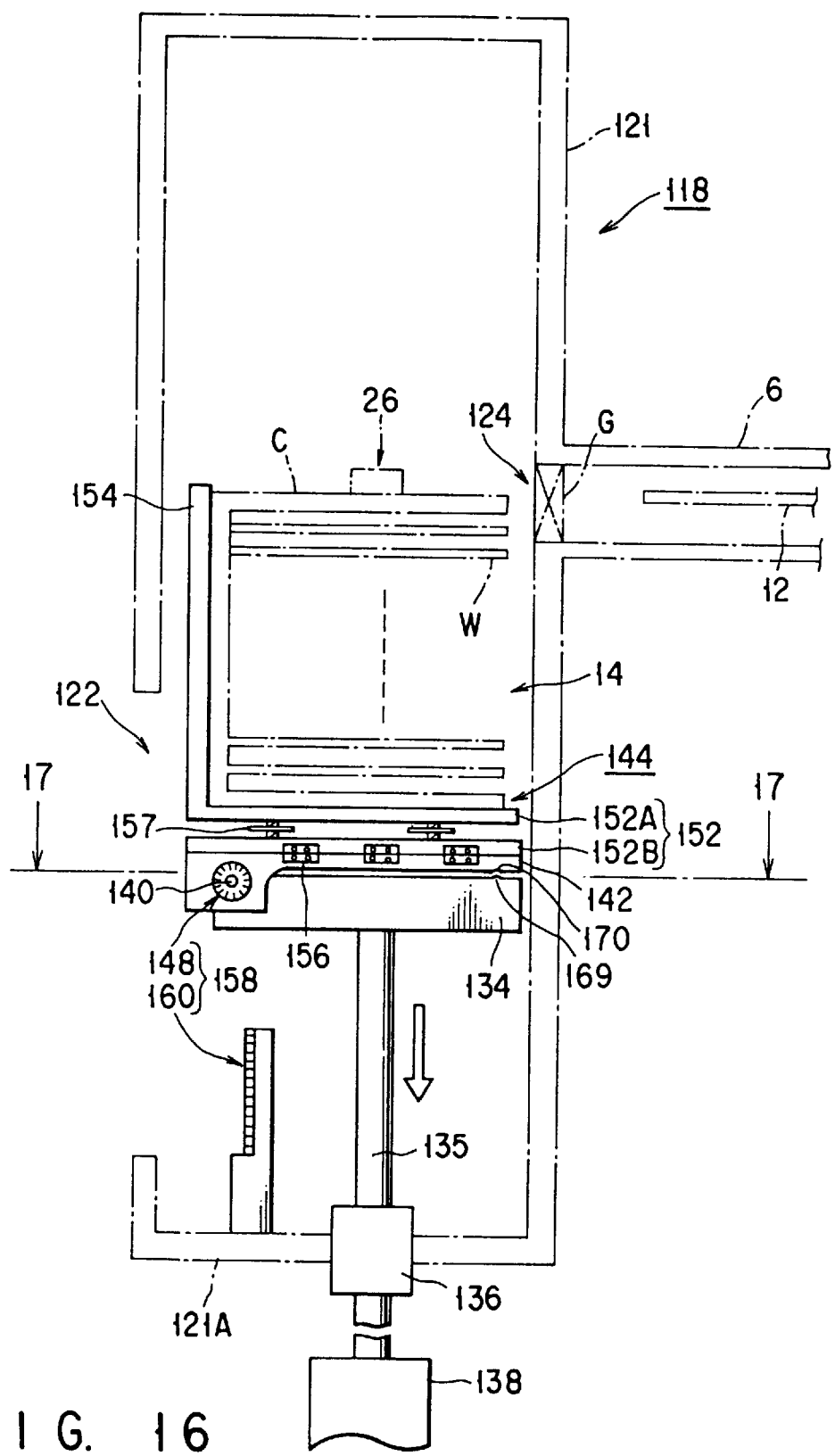
F I G. 16

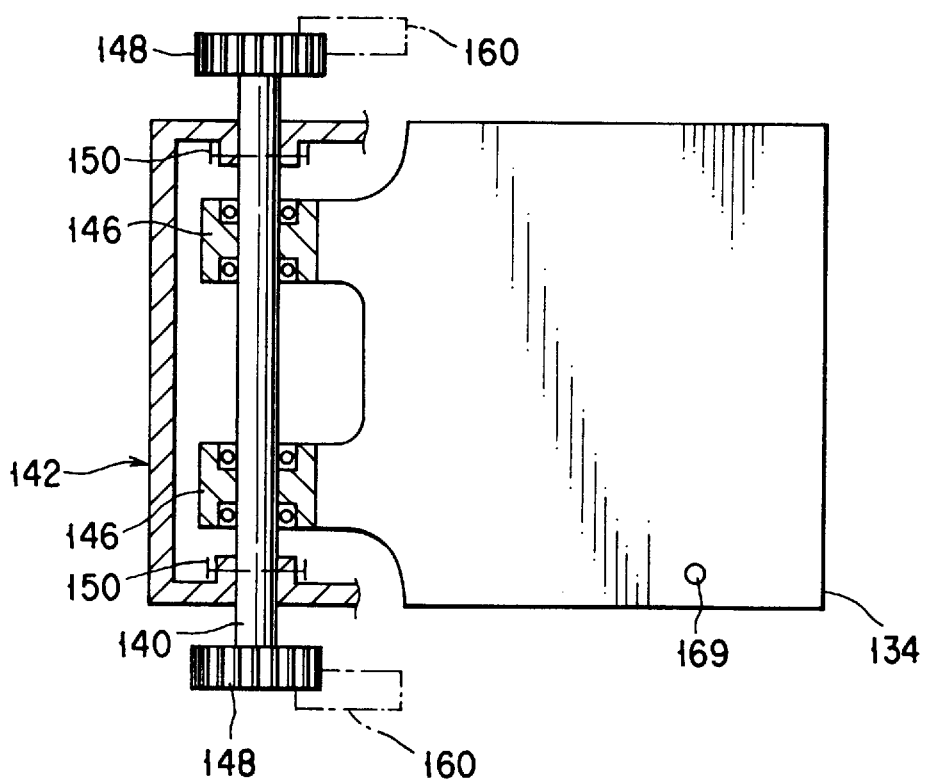
F I G. 17

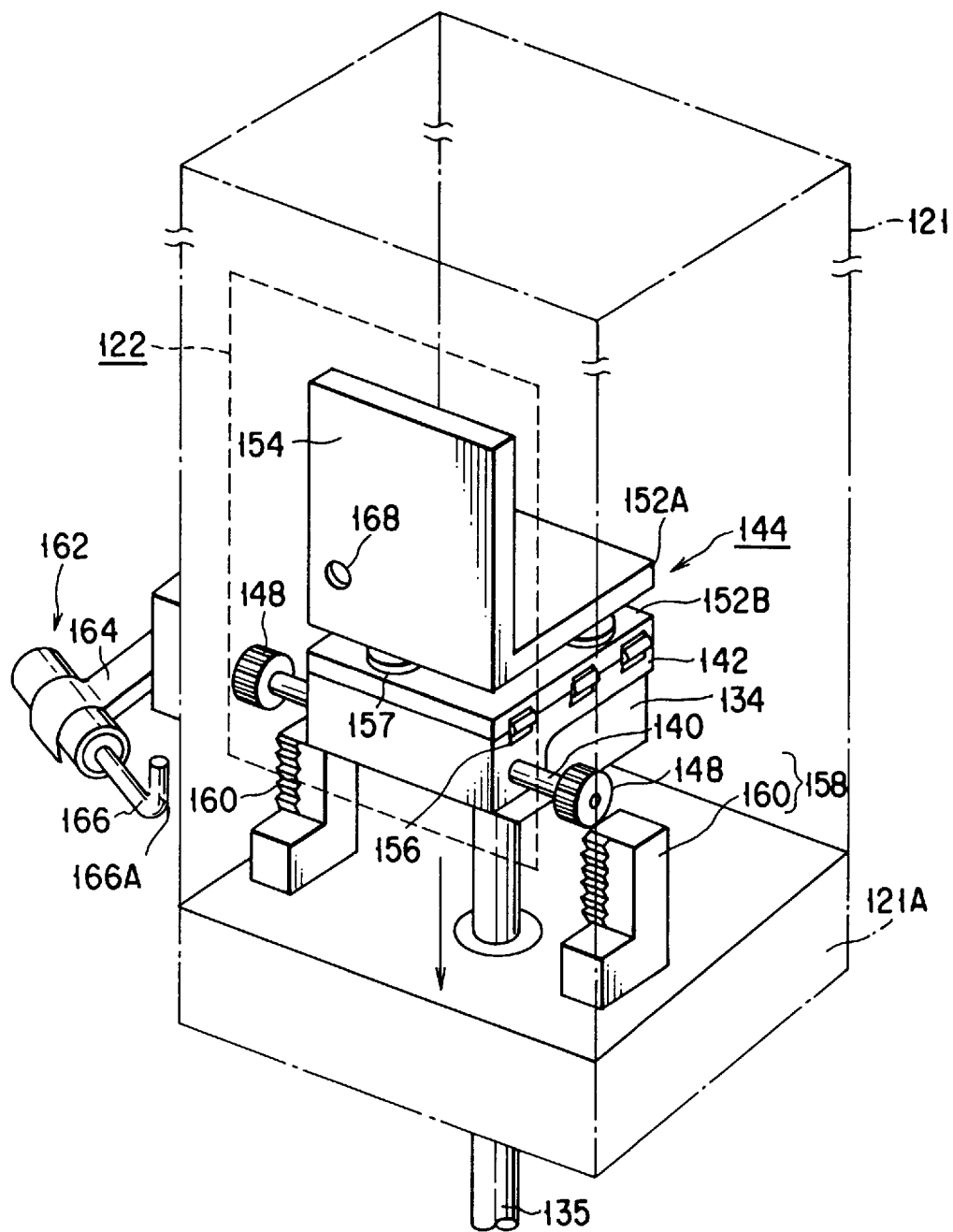
F I G. 18

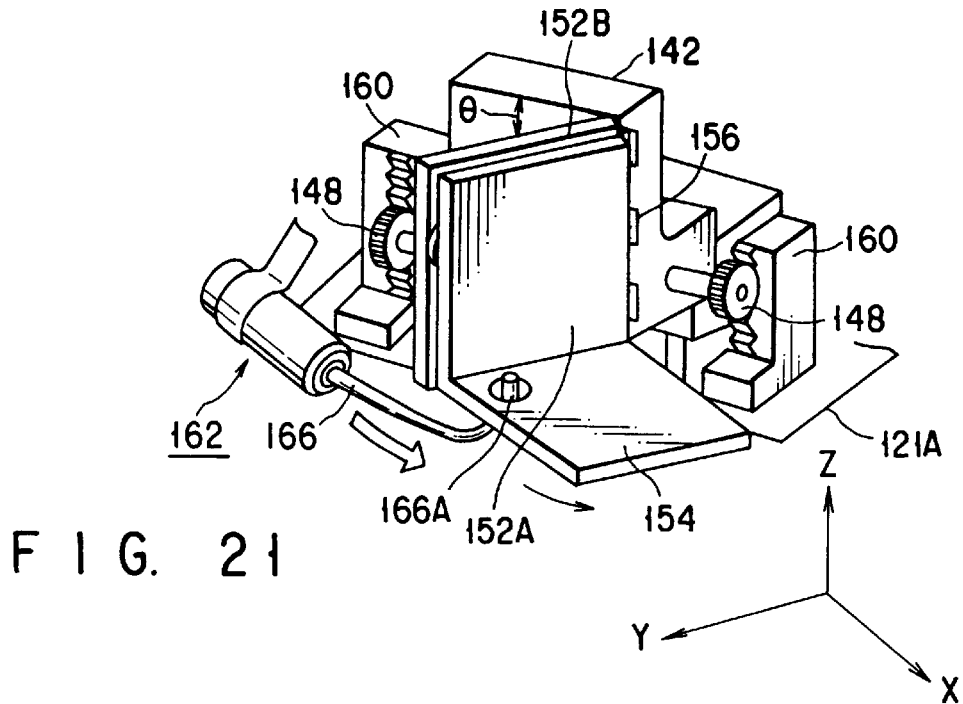
F I G. 21
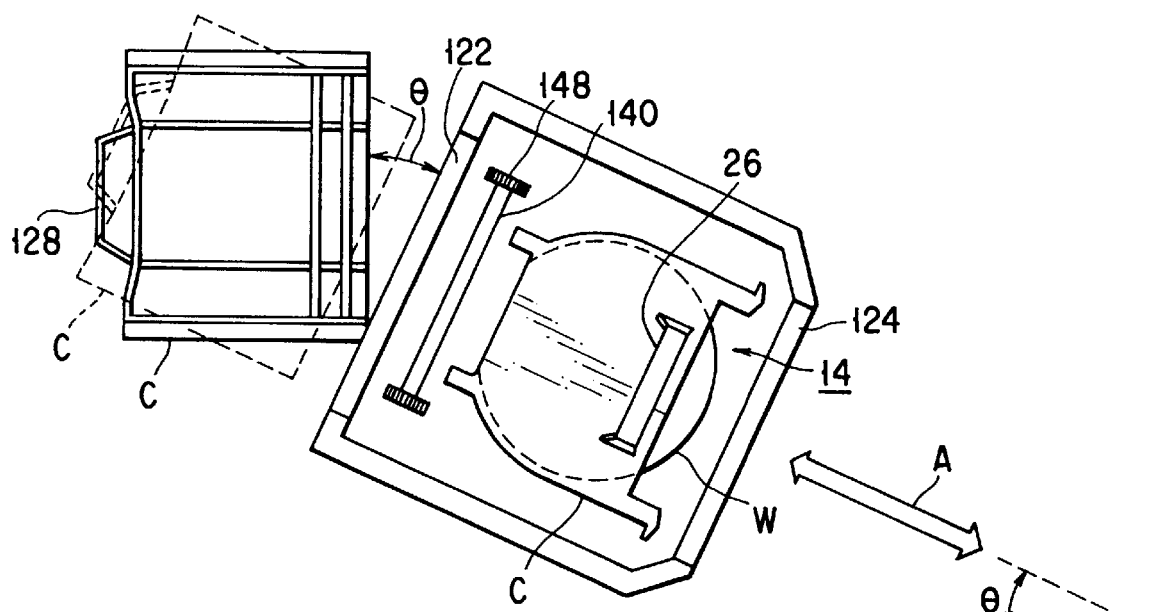
F I G. 22

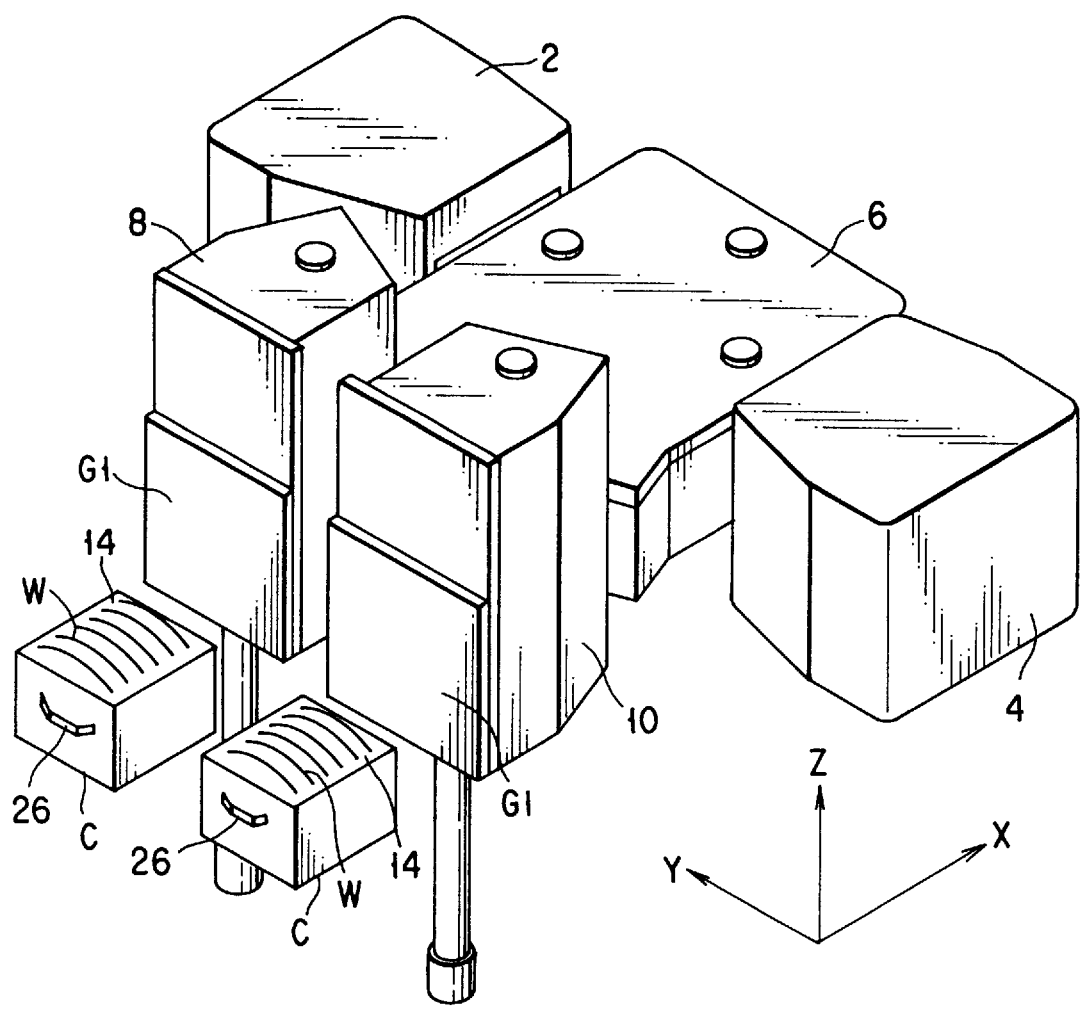
F I G. 23

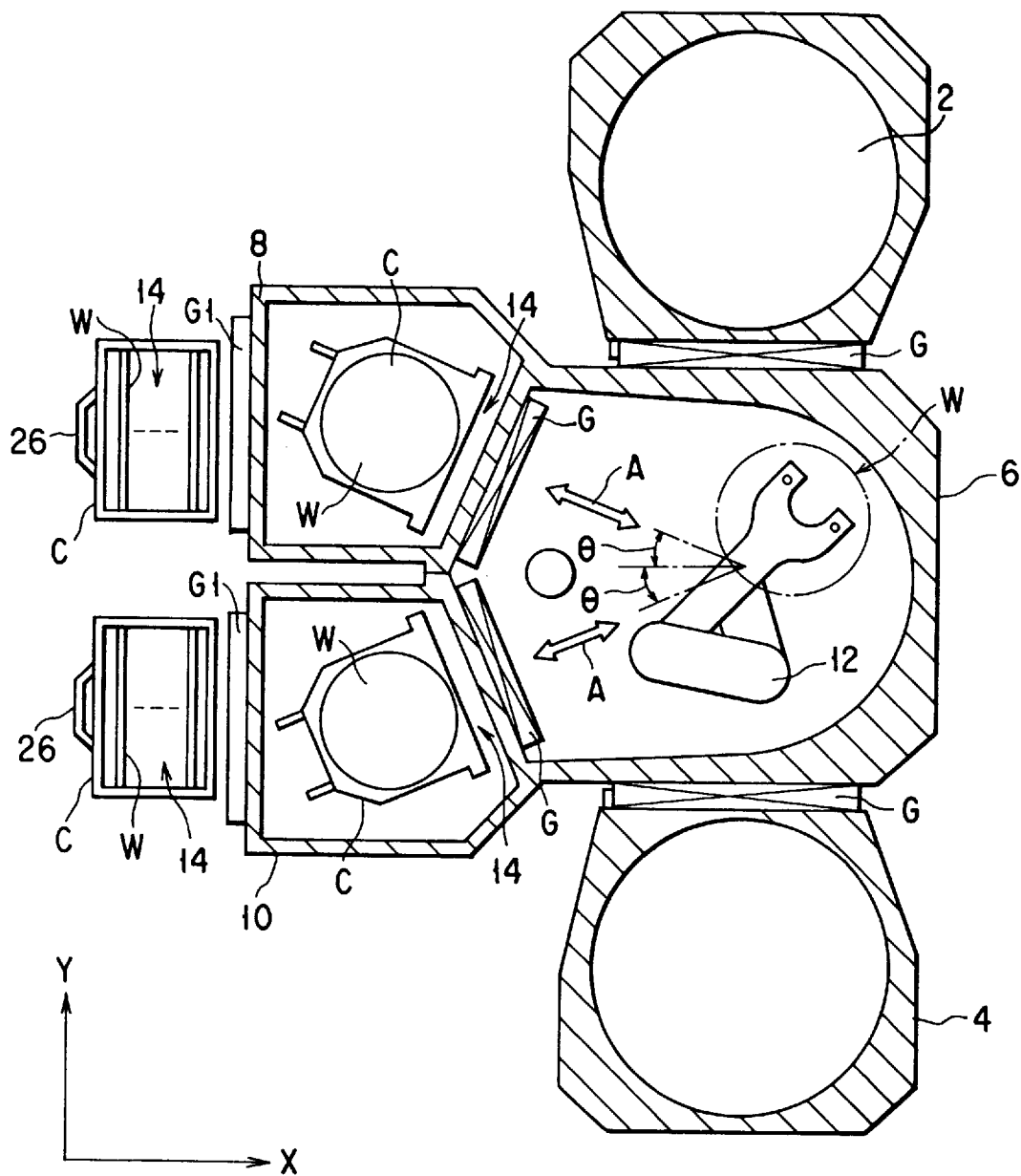
F I G. 24

CASSETTE CHAMBER

BACKGROUND OF THE INVENTION

The present invention relates to a cassette chamber into and from which a cassette stored with objects of treatment, such as semiconductor wafers, is loaded and unloaded.

Generally, in subjecting semiconductor wafers to any of various treatments, such as film formation, etching, thermal oxidation, etc., a cassette stored with a large number of wafers, e.g., 25 wafers, is first loaded into a cassette chamber. Thereafter, each wafer in the cassette is delivered into a process chamber through a transfer chamber by means of a transportation arm in a vacuum.

In setting the cassette in the cassette chamber, the cassette is placed on a stage in the chamber in a manner such that its wafer loading/unloading aperture faces upward. Thereafter, the cassette is rotated substantially through 90° by means of a drawbridge-type drive mechanism in the cassette chamber as it is taken into the chamber, and the wafer loading/unloading aperture having so far been kept upward is oriented in the horizontal direction.

In general, a plurality of cassette chambers, e.g., two chambers, are connected to one transfer chamber that is provided with one transportation arm. Accordingly, each of cassettes in the two cassette chambers is directed so that its horizontally oriented wafer loading/unloading aperture is reoriented in the moving direction of the transportation arm, whereby the single arm can access the individual cassettes in the two chambers.

FIG. 23 shows a cluster tool apparatus, in which semiconductor wafers W are fed into process chambers and treated therein by the aforesaid series of processes of operation. This apparatus mainly comprises two process chambers 2 and 4, one transfer chamber 6 connected to the chambers 2 and 4, and two cassette chambers 8 and 10 connected to the chamber 6. These chambers can communicate with one another by means of gate valves G that can be closed airtightly. As shown in FIG. 24, the transfer chamber 6 contains therein a bendable rotatable transportation arm 12 of, for example, a multi-joint type, which can load and unload semiconductor wafers W stored in cassettes C in the cassette chambers 8 and 10.

In general, each cassette C must be placed on a stage outside a gate door G1 of each corresponding cassette chamber 8 or 10 in a manner such that it faces itself in the X-axis direction of FIG. 23 and that its wafer loading/unloading aperture 14 faces upward (or in the Z-axis direction). In order to take the cassettes C into the cassette chambers 8 and 10 and take out the semiconductor wafers W from the cassettes C in the two cassette chambers 8 and 10 by means of the single transportation arm 12, therefore, each cassette C must be rotated horizontally while being set upright so that the wafer loading/unloading aperture 14 is directed toward the center of the transportation arm 12 (or oriented in a moving direction A).

Apparatuses for this operation are described in, for example, U.S. Pat. Nos. 5,186,594 and 5,507,614. In the apparatus disclosed in U.S. Pat. No. 5,186,594, the cassette C placed on the stage outside the cassette chamber 8, with its wafer loading/unloading aperture 14 upward, is rotated through 90° around the Y-axis of FIG. 23 by means of a drawbridge-type drive mechanism. Thereupon, the cassette C is taken into the chamber 8, and its aperture 14, having so far been kept upward (or in the Z-axis direction), is reoriented in the horizontal direction (X-axis direction). Then, the cassette C is rotated through a predetermined angle θ around the Z-axis of FIG. 23 by means of a pivot mechanism, whereupon its wafer loading/unloading aperture 14 is directed toward the center of the arm 12 (see FIG. 25). In the apparatus disclosed in U.S. Pat. No. 5,507,614, on the other hand, a tilted shaft that is oriented at a predetermined angle to the direction of gravity is rotated so that the cassette C can be situated at one operation in a predetermined position with its aperture 14 directed toward the center of the arm 12.

The apparatus stated in U.S. Pat. No. 5,186,594 requires the pivot mechanism as well as the drawbridge-type drive mechanism, that is, it needs use of separate drive mechanisms for rotating the cassette C through 90° around the Y-axis and through the predetermined angle around the Z-axis. Consequently, a lot of complicated drive mechanisms must be used in each cassette chamber, so that the manufacturing cost is high, and more particles are produced. As for the apparatus described in U.S. Pat. No. 5,507,614, it is designed so that the obliquely extending shaft is rotated. As compared with the case in which the cassette is rotated horizontally, therefore, the rotation mechanism section of this apparatus includes more biased portions, so that more particles are produced correspondingly. Since the cassette C is rotated obliquely, moreover, the rotation requires a wide space, so that the chamber is inevitably large-sized.

BRIEF SUMMARY OF THE INVENTION

The object of the present invention is to provide a cassette chamber of simple construction, which is provided with a drive mechanism capable of loading a horizontally oriented cassette into the chamber while setting it upright and orienting a wafer loading/unloading aperture of the cassette in the access direction of a transportation arm.

The above object of the present invention is achieved by a cassette chamber, which comprises: a housing defining a space stored with a cassette for holding a plurality of objects of treatment; a lift base having a rotatable shaft and located in the housing for up-and-down motion; an auxiliary base fixed to the shaft and inclined at a predetermined angle to the longitudinal direction of the shaft; a cassette support having a bottom support portion set on the lift base and bearing the bottom face of the cassette and a back support portion rockably supported by the auxiliary base and bearing the back face of the cassette; a rotation mechanism for rotating the shaft as the lift base ascends or descends, thereby rotating the auxiliary base and the cassette support between a first position inside the housing and a second position outside the housing; and a support section for keeping the back support portion of the cassette support parallel to the shaft by engaging the back support portion being rotated to the second position by the rotation mechanism and causing the back support portion to rock relatively to the auxiliary base.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a side view schematically showing a cassette chamber according to a first embodiment of the present invention;

FIG. 5 is a side view of the cassette chamber taken in the direction of the arrow of FIG. 3;

FIG. 6 is a schematic view showing the principal part of the cassette chamber of FIG. 1;

FIG. 9A is a schematic view showing a third modification of the support member and a cassette support capable of bearing the cassette thereon;

FIG. 9B is a schematic view showing the cassette support of FIG. 9A and the cassette placed thereon;

FIG. 12 is a perspective view schematically showing a cassette chamber according to a second embodiment of the invention;

FIG. 13 is a plan view showing a guide rail member provided in the cassette chamber of FIG. 12 and a guide roller attached to the rail member;

FIG. 14 is a side view showing a cassette rotated through 90° from the state shown in FIG. 12;

FIG. 15 is a top sectional view showing a cluster tool apparatus having cassette chambers according to a third embodiment of the invention;

FIG. 16 is a side view schematically showing one of the cassette chambers according to the third embodiment;

FIG. 17 is a sectional view taken along line 17—17 of FIG. 16;

FIG. 18 is a perspective view showing a cassette set in a wafer delivery position in the cassette chamber of FIG. 16;

FIG. 21 is a perspective view showing the cassette rotated through a predetermined angle in the horizontal direction by means of an actuator in the cassette chamber of FIG. 16;

FIG. 22 is a plan view for briefly illustrating the way the cassette is set in the wafer delivery position in the cassette chamber of FIG. 16;

FIG. 23 is a perspective view of a typical cluster tool apparatus having cassette chambers;

FIG. 24 is a top sectional view showing the cluster tool apparatus of FIG. 23.

DETAILED DESCRIPTION OF THE INVENTION

Preferred embodiments of a cassette chamber according to the present invention will now be described with reference to the accompanying drawings.

FIGS. 1 to 6 show a cassette chamber 8 according to a first embodiment of the invention. The chamber 8 according to present embodiment, like the cassette chamber 8 of the cluster tool apparatus shown in FIGS. 23 and 24, is connected to a transfer chamber 6 having a transportation arm 12.

Figure 4:
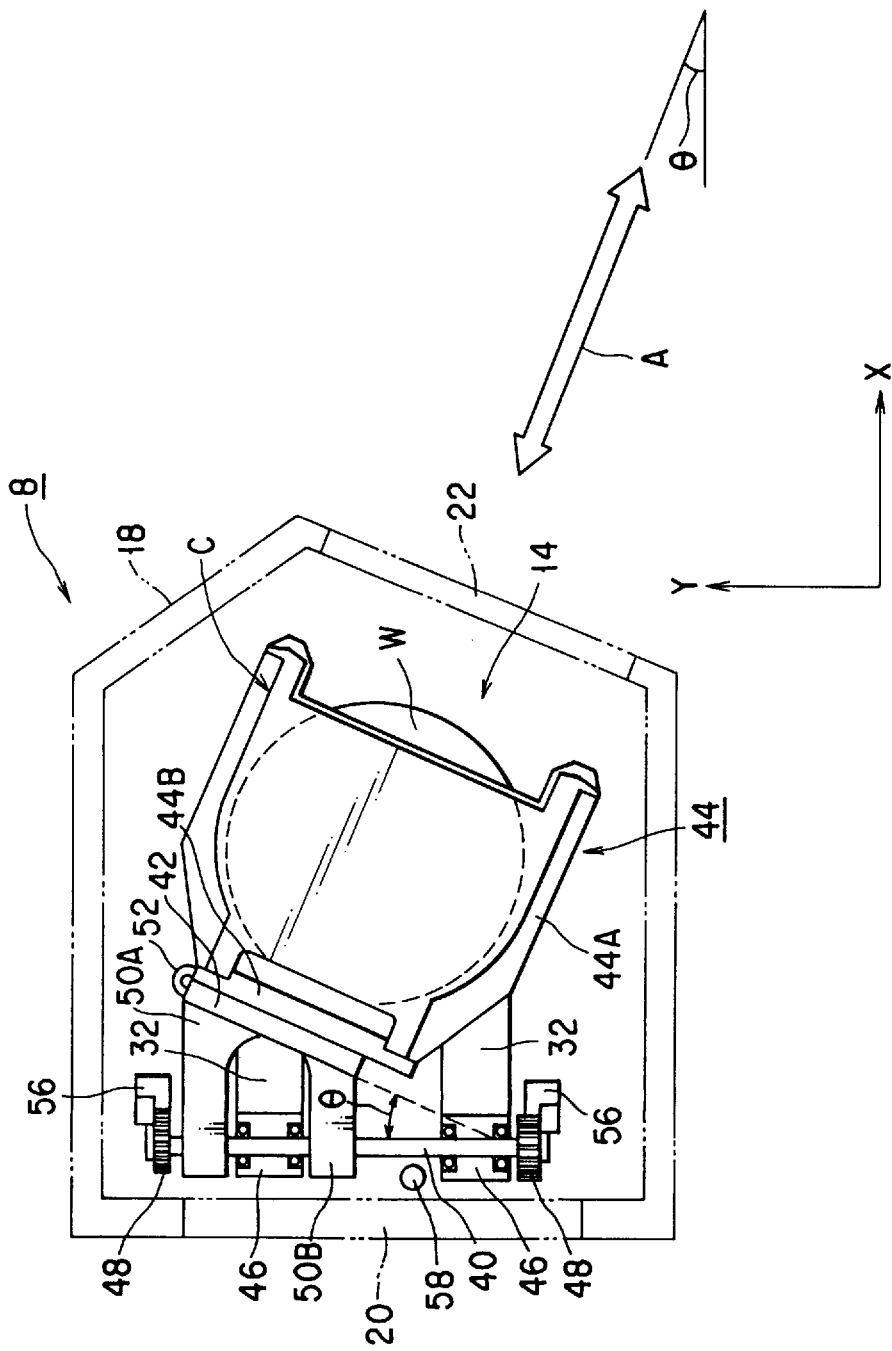
FIG. 4 is a plan view showing the cassette set in the wafer delivery position in the cassette chamber of FIG. 1.
Figure 7:
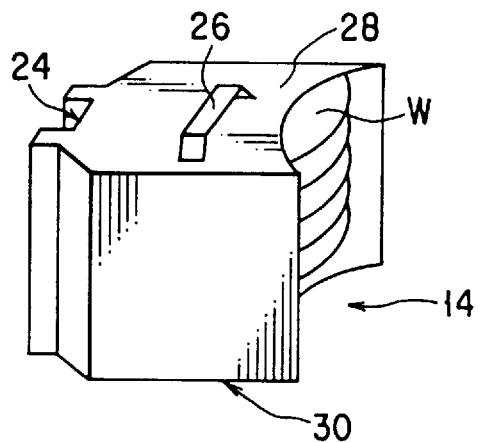
FIG. 7 is a perspective view of the cassette.

As shown in FIG. 1, the cassette chamber 8 of the present embodiment includes a rectangular chamber vessel 18 of, e.g., aluminum. The vessel 18 is provided with a cassette loading aperture 20 in one side face thereof, through which a cassette C can be passed. As shown in FIG. 23, the aperture 20 is closed by an open-close gate door G1 (not shown in FIG. 1). A wafer unloading aperture 22 is formed in the upper part of the other side face of the vessel 18. The aperture 22 is connected to the transfer chamber 6 by means of an open-close gate valve G. As shown in FIG. 4, the cassette loading aperture 20 opens in the X-axis direction, while the wafer unloading aperture 22 opens in a direction at a predetermined angle θ (e.g., 22.5°) to the X-axis direction, that is, an access direction A in which the transportation arm 12 in the transfer chamber 6 accesses the cassette chamber 8. The cassette C can store, for example, 25 semiconductor wafers W therein. As shown in FIG. 7, moreover, the cassette C has a wafer loading/unloading aperture 14 through which the wafers W are loaded and unloaded, and that side face of the cassette C which is opposite to the aperture 14 is formed as a back face 24. Further, the cassette C has a top face 28, which is provided with a handle 26, and a bottom face 30.

As shown in FIG. 1, a lift pedestal 32 is provided in the chamber vessel 18. A lift rod 34 is connected to the underside of the pedestal 32. The rod 34 air-tightly penetrates a bottom portion 18A of the vessel 18 with the aid of a seal 36, such as an O-ring, and is moved up and down by means of a lift mechanism 38.

As shown in detail in FIGS. 4 and 6, a main shaft 40 is rotatably supported on one side portion of the lift pedestal 32 near the cassette loading aperture 20 by means of two bearings 46. Pinion gears 48, which constitute part of a rotation mechanism 54 (mentioned later), are fixed individually to the opposite ends of the shaft 40. Preferably, the gears 48 are formed of a resin having relatively high hardness, in order to restrain production of particles.

The main shaft 40 is fitted with an auxiliary pedestal 42, which extends vertically (in the Z-axis direction), by means of two arms 50A and 50B. In this case, one end of each of the arms 50A and 50B is fixed to the shaft 40, while the other end thereof is fixed to, for example, a lower region of the auxiliary pedestal 42. Thus, the pedestal 42 can be rotated integrally with the shaft 40 so that it projects outside the chamber 8. The first arm 50A is made to be a little longer than the second arm 50B so that the auxiliary pedestal 42 faces in the access direction (moving direction) A of the transportation arm 12 at the predetermined angle θ (e.g., 22.5°) to the longitudinal direction (Y-axis direction) of the shaft 40.

An L-shaped cassette support 44, which extends beyond the other side portion of the auxiliary pedestal 42, is attached to one side portion of the pedestal 42 by means of a hinge 52. The support 44 is composed of a bottom support portion 44A for bearing and holding the bottom face 30 of the cassette C and a back support portion 44B for bearing and holding the back face 24 of the cassette. The back support portion 44B is bonded to the bottom support portion 44A at right angles thereto, and its one side portion is attached to the one side portion of the auxiliary pedestal 42 by means of the hinge 52. The hinge 52 is provided with an elastic member, such as a spring, which continually urges the back support portion 44B to engage the pedestal 42. Normally, therefore, the back support portion 44B is caused, by means of the urging force of the elastic member, to engage (abut against) the pedestal 42 and face in the access direction A of the transportation arm 12. Only when it is subjected to a force that resists the urging force of the elastic member, the support portion 44B rotates around the hinge 52 and is disengaged (away) from the auxiliary pedestal 42.

As is clearly shown in FIGS. 1 and 4, two stationary racks 56 are set up vertically on the bottom portion 18A of the chamber vessel 18, in positions where they can mesh with their corresponding pinion gears 48. Preferably, the racks 56 are formed of a resin having relatively high hardness, in order to restrain production of particles.

The stationary racks 56, along with the pinion gears 48, constitute the rotation mechanism 54 for rotating the cassette support 44. The racks 56 mesh with their corresponding gears 48 that ascend and descend as the lift rod 34 moves up and down. As the gears 48 are rotated, the main shaft 40 is rotated, and the cassette support 44, which is fixed to the shaft 40 by means of the auxiliary pedestal 42, is rotated. More specifically, the racks 56 have their tooth shape and height set so that they can rotate the pinion gears 48 through 90°, and moreover, can rotate the descending and ascending gears 48 in the counterclockwise and clockwise directions of FIG. 1, respectively. Thus, when the lift pedestal 32 descends, the rotation mechanism 54 rotates the cassette support 44 through 90° in the counterclockwise direction, thereby causing it to project outward from the cassette chamber 8 through the cassette loading aperture 20. When the pedestal 32 ascends, the mechanism 54 rotates the support 44 through 90° in the clockwise direction, thereby situating it inside the chamber 8.

Figure 2:
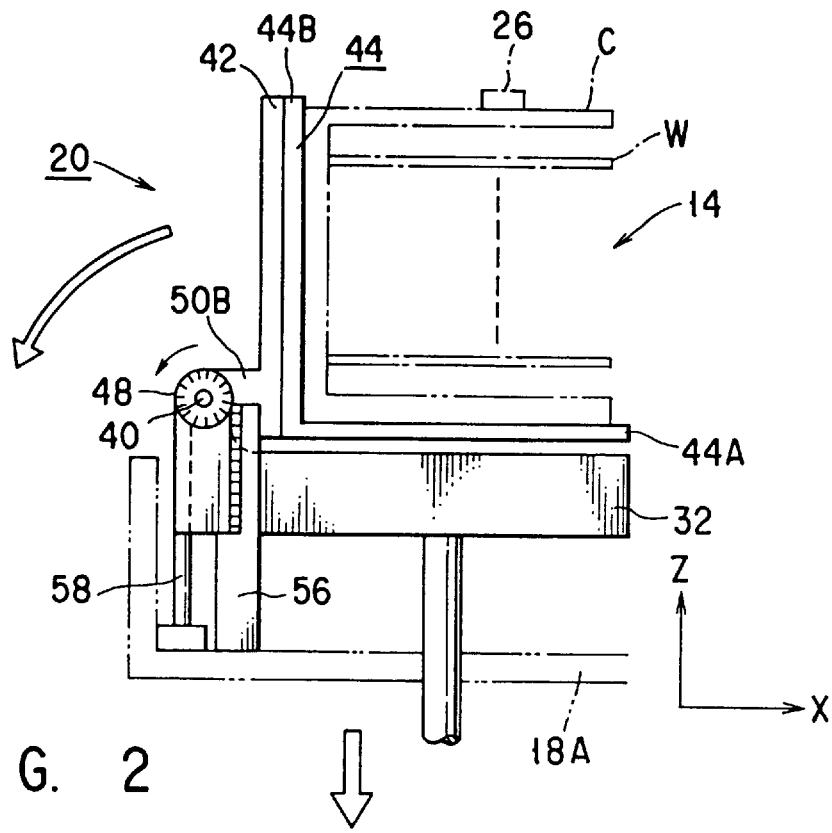
FIG. 2 is a side view showing a cassette lowered from a wafer delivery position by means of a lift mechanism for the cassette chamber of FIG. 1.
Figure 3:
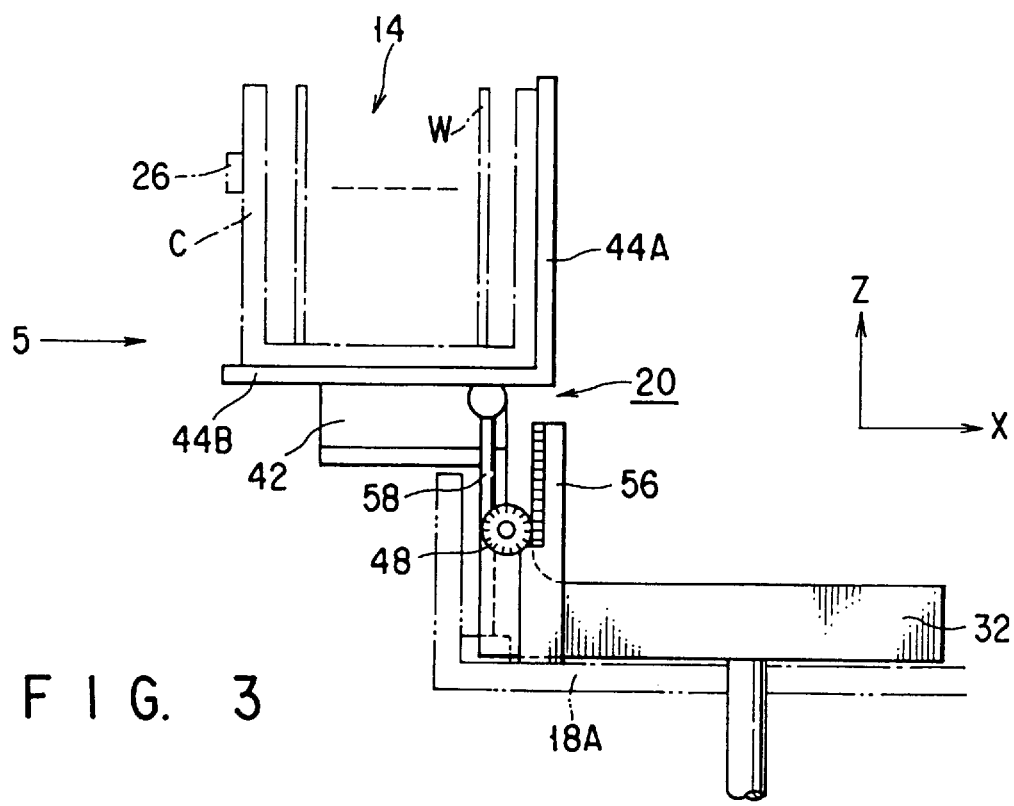
FIG. 3 is a side view showing the cassette rotated through 90° by means of a rotation mechanism in the cassette chamber of FIG. 1.

Further, a support member 58 is set up vertically on the bottom portion 18A of the chamber vessel 18. The support member 58 engages the free end side of the back support portion 44B of the cassette support 44, which rotates so as to project outward from the cassette loading aperture 20, and causes the support portion 44B to rotate around the hinge 52, resisting the urging force of the elastic member attached to the hinge 52, whereupon the support portion 44B is disengaged from the auxiliary pedestal 42. More specifically, the height of the support member 58 is set so that the back support portion 44B is kept horizontal when the cassette support 44 is rotated through 90° in the counterclockwise direction around the main shaft 40, as shown in FIGS. 3 and 5.

In order to position the cassette support 44 with respect to the lift pedestal 32, the pedestal 32 is provided with a projection 60 on its upper surface, while the bottom support portion 44A has a recess 62 on its lower surface (see FIG. 1). The projection 60 can be fitted in the recess 62.

The following is a description of the operation of the cassette chamber 8 constructed in this manner.

FIGS. 1 and 4 show a state in which the cassette C, holding the semiconductor wafers W therein, is located in a wafer delivery position in the upper part of the chamber vessel 18. In this state, the cassette support 44 is caused to abut against the auxiliary pedestal 42 by the urging force of the elastic member, and is oriented in the access direction (moving direction) A of the transportation arm 12 (or is directed at the predetermined angle θ to the X-axis direction). Thus, the wafer loading/unloading aperture 14 of the cassette C placed on the cassette support 44 is opposed to the wafer unloading aperture 22 of the chamber vessel 18, and is also oriented in the access direction A of the arm 12 in the transfer chamber 6. In this state, moreover, the load of the cassette C is borne by the bottom support portion 44A of the cassette support 44.

In discharging (unloading) the cassette C in the state of FIG. 1 from the chamber vessel 18, the lift rod 34 is first moved downward to lower the lift pedestal 32. When the pedestal 32 is lowered to a predetermined height, the pinion gears 48, fixed individually to the opposite ends of the main shaft 40, mesh with the teeth of the stationary racks 56 that are set up on the bottom portion 18A of the vessel 18 (see FIG. 2). When the lift pedestal 32 is further lowered with the gears 48 and the racks 56 in mesh with one another, the gears 48 rotate in the counterclockwise direction of FIG. 1 as they descend along their corresponding racks 56. Also, the main shaft 40, which is integral with the pinion gears 48, descends rotating counterclockwise. Accordingly, the auxiliary pedestal 42, which is fixed to the shaft 40 by means of the arms 50A and 50B, and the cassette support 44 also descend rotating counterclockwise, whereupon the wafer loading/unloading aperture 14 of the cassette C, having so far been oriented in the horizontal direction, starts gradually to turn upward.

When the cassette support 44 is lowered to a predetermined height while rotating counterclockwise in this manner, the cassette C, along with the support 44, projects outward from the chamber vessel 18 through the cassette loading aperture 20. At the same time, the upper end of the support member 58 abuts against the back of the free end side of the back support portion 44B of the support 44, thereby preventing the free end side of the back support portion 44B (support 44) from descending further. When the cassette support 44 in this state is further rotated, that is, when the auxiliary pedestal 42 is lowered rotating as the lift pedestal 32 descends, the back support portion 44B, having so far been in contact with the pedestal 42, rotates around the hinge 52 and is disengaged from the pedestal 42. When the cassette support 44 is rotated counterclockwise through 90°, the descent of the lift pedestal 32 is stopped, and the support 44 is stopped from rotating further. FIGS. 3 and 5 show the resulting state. As shown in these drawings, the back support portion 44B projects outward from the chamber vessel 18 through the cassette loading aperture 20 in a manner such that it is kept horizontal by the holding action of the support member 58. Thus, the cassette C also projects outside the vessel 18, and its load is borne by the back support portion 44B with the wafer loading/unloading aperture 14 facing upward (in the Z-axis direction).

When the aforesaid operation is carried out reversely from the state shown in FIGS. 3 and 5, the cassette C is loaded into the chamber vessel 18, and the wafer loading/unloading aperture 14 is oriented in the access direction A of the transportation arm 12. When the lift pedestal 32 is raised from the state of FIGS. 3 and 5, the cassette support 44 is lifted rotating clockwise. Thereupon, the back support portion 44B and the support member 58 are disengaged from each other, and the support portion 44B is brought into contact with the auxiliary pedestal 42. When the cassette support 44 in this state is further raised and rotated clockwise through 90°, it is set in the state shown in FIG. 2. When the lift pedestal 32 in this state is raised to a predetermined height, the cassette support 44 is oriented in the access direction (moving direction) A of the transportation arm 12. Thus, the wafer loading/unloading aperture 14 of the cassette C placed on the support 44 is opposed to the wafer unloading aperture 22 of the chamber vessel 18, and is also oriented in the access direction A of the arm 12 in the transfer chamber 6.

According to the cassette chamber 8 of the present embodiment, as described above, the cassette C, kept horizontal so that its wafer loading/unloading aperture 14 faces upward, can be set upright as it is loaded into the chamber 8 and moved to the wafer delivery position, by only moving the lift rod 34 upward. By only moving the rod 34 downward, on the other hand, the cassette C in the wafer delivery position can be unloaded from the cassette chamber 8 in a manner such that its aperture 14 upward. Thus, in the cassette chamber 8 of the present embodiment, the cassette support 44 is oriented in the access direction A of the transportation arm 12, so that a drive mechanism need not be provided for orienting the cassette C in the access direction A of the arm 12. Accordingly, the number of drive mechanisms used in the chamber 8 can be reduced, so that production of particles can be restrained. In contrast with this, the apparatus described in U.S. Pat. No. 5,186,594 requires use of separate drive mechanisms for rotating the cassette C through 90° around the Y-axis and through the predetermined angle around the Z-axis. According to this arrangement, therefore, a lot of complicated drive mechanisms must be used in each cassette chamber, so that the manufacturing cost is high, and more particles are produced. According to the cassette chamber 8 of the present embodiment that requires use of no drive mechanism for rotating the cassette C around the Z-axis, compared with the apparatus described in U.S. Pat. No. 5,186,594, the fewer drive mechanisms result in restrained production of particles, and the simple construction permits reduction in cost.

Since the cassette chamber 8 of the present embodiment has no obliquely extending shaft, moreover, its rotation mechanism section includes no such biased portions as the tilted shaft described in U.S. Pat. No. 5,507,614, so that only small quantities of particles are produced. Since the cassette C need not be rotated around any diagonal axes, moreover, rotation requires only a small space, so that the chamber 8 can be manufactured with a compact design.

The arrangement of the cassette chamber 8 according to the present embodiment is also applicable to a cassette chamber 10 that adjoins the cassette chamber 8. It is to be understood, in this case, that the respective lengths of arms 50A and 50B of the cassette chamber 10 are made to be opposite in superiority to those of the cassette chamber 8 and the hinge 52 is attached to the other side portion of the auxiliary pedestal 42, in order to orient the cassette support 44 in the access direction A of the transportation arm 12. According to a modification of the present embodiment, moreover, the lift pedestal 32 has a space that can store a plurality of dummy wafers for inspection, for example.

Figure 8A:
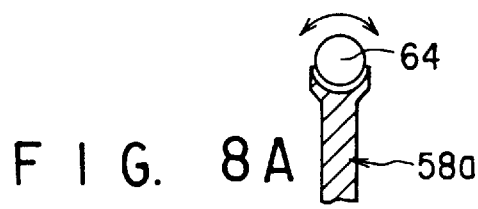
FIG. 8A is a sectional view showing a first modification of a support member.

FIG. 8A shows a first modification of the support member. As shown in FIG. 8A, this support member 58a has a rotatable spherical member 64 on its upper end. Preferably, the spherical member 64 is formed of a resin in order to restrain production of particles. With use of the rotatable spherical member 64, the coefficient of friction between the support member 58a and the back support portion 44B of the cassette support 44 is so low that production of particles can be further restrained.

Figure 8B:
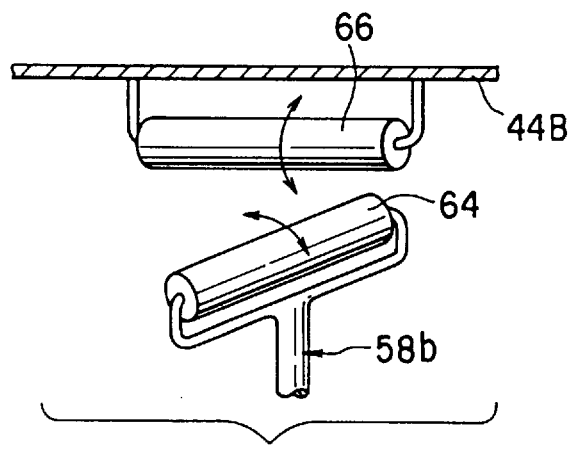
FIG. 8B is a sectional view showing a second modification of the support member.

FIG. 8B shows a second modification of the support member. As shown in FIG. 8B, this support member 58b has a rotating roller 64 on its upper end. Preferably, the roller 64 is formed of a resin, and its length is adjusted to about 3 cm, for example. Further, a rotating roller 66 is provided on the back of the back support portion 44B of the cassette support 44, in a region such that it can be in contact with the roller 64. In this case, the rollers 64 and 66 are arranged so as to cross each other at an angle of about 90°. According to this arrangement, the coefficient of friction between the rollers 64 and 66 is so low that production of particles can be restrained.

FIGS. 9A and 9B show a third modification 58c of the support member. Provided on the upper end of the support member 58c is a micro-switch 90 for detecting the presence of a cassette C on the cassette support 44, at the unloading position. An optical sensor (not shown) is mounted on one side of the cassette chamber 8, for detecting the presence of a cassette C on the support 44, at the loading position. Two leaf springs 91A and 91B are provided on the bottom 44A and back 44B of the support 44, respectively. The leaf spring 91A has a projection 300. Two pins 92A and 92B are provided on the bottom 44A and back 44B of the support 44, respectively. The pins 92A and 92B can project outwards to push the leaf springs 91A and 91B, respectively.

When no cassette C is placed on the cassette support 44 as shown in FIG. 9A, neither the pin 92A nor the pin 92B projects outwards. Thus, the spring 91A is not pushed from the bottom 44A of the support 44. Nor is the spring 91B pushed from the back 44B of the support 44. Even if the support member 58c abuts on the back 44B at the unloading position, the leaf spring 91B does not actuate the micro-switch 90. Similarly, at the loading position, the projection 300 of the leaf spring 91A does not enter the optical path p of the optical sensor. It is thus detected that no cassette C is mounted on the cassette support 44.

When a cassette C is placed on the support 44 as shown in FIG. 9B, both pins 92A and 92B project outwards, pushing the springs 91A and 91B from the bottom 44A and back 44B of the support 44, respectively. In this case, the support member 58c abuts on the back 44B of the support 44 at the unloading position, whereby the micro-switch 90 is actuated, and the projection 300 of the leaf spring 91A enters the optical path p of the optical sensor at the loading position. It is thus detected that a cassette C is mounted on the cassette support 44.

Figure 10:
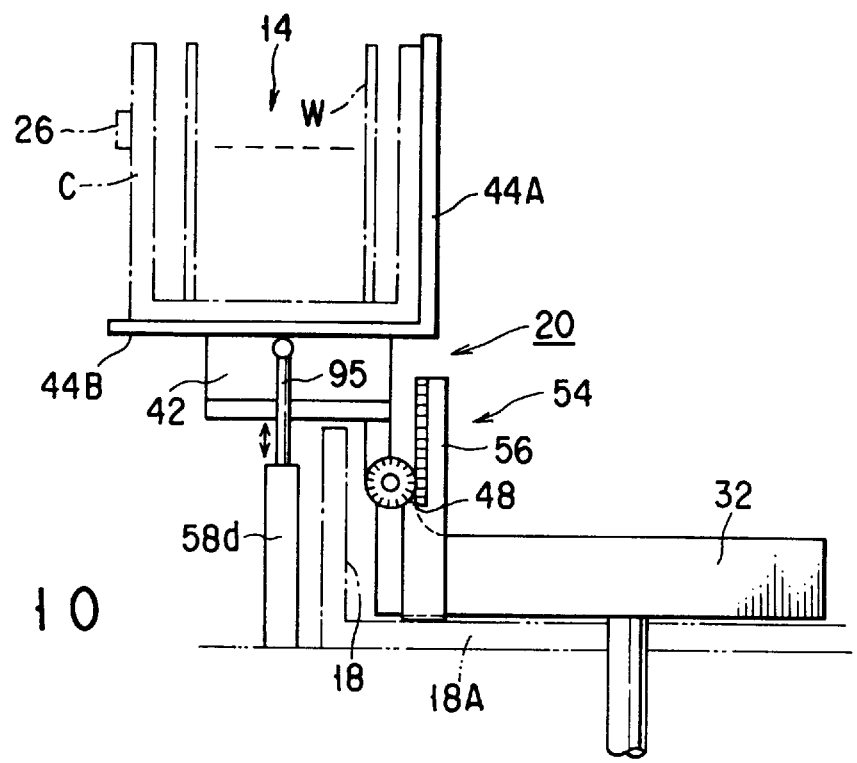
FIG. 10 is a side view similar to FIG. 3, showing the cassette chamber of FIG. 1 furnished with a fourth modification of the support member.
Figure 11:
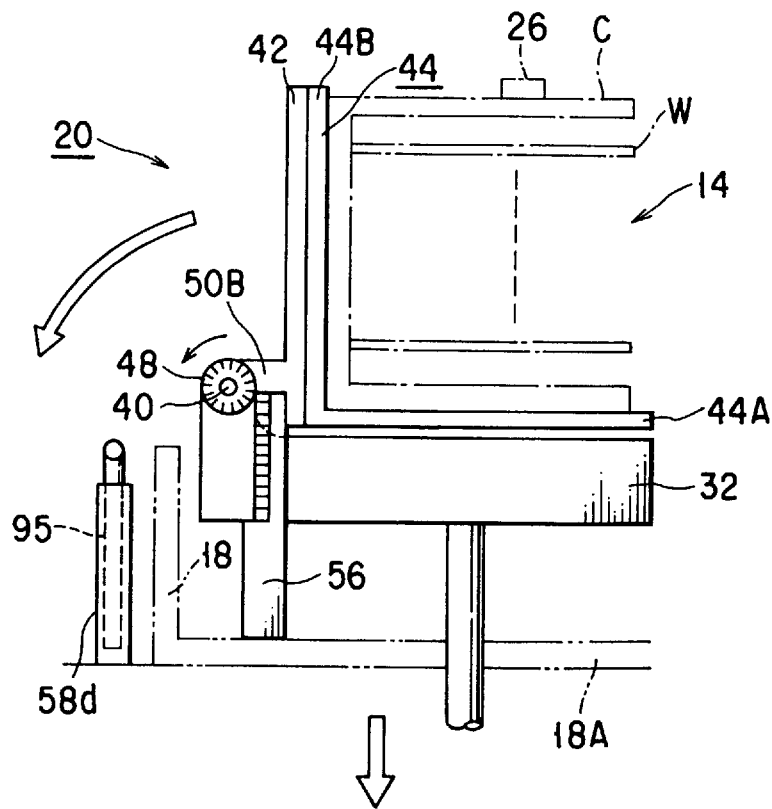
FIG. 11 is a side view similar to FIG. 2, showing the cassette chamber of FIG. 1 furnished with the fourth modification of the support member.
Figure 19:
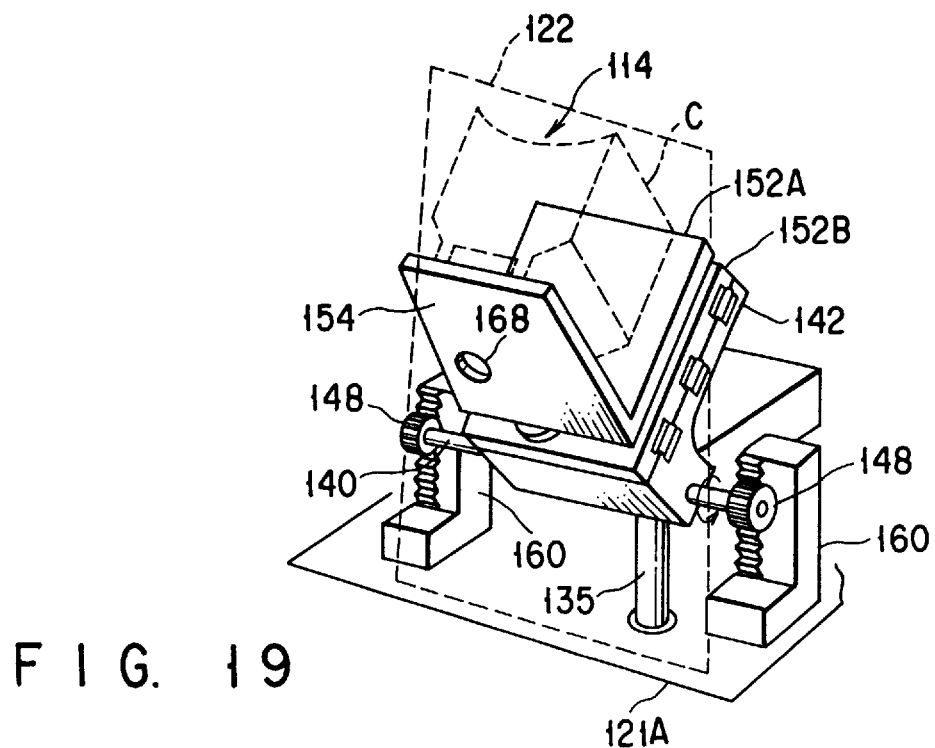
FIG. 19 is a perspective view showing the cassette rotated by means of a rotation mechanism in the cassette chamber of FIG. 16.

FIGS. 10 and 11 show a state in which the cassette chamber 8 shown in FIG. 1 is provided with a support member 58d according to a fourth modification. As shown in these drawings, the support member 58d is composed of an air cylinder having a rod 95 that moves up and down. The member 58d is situated close to the cassette loading aperture 20 and outside the chamber vessel 18. When the cassette support 44 is rotated to the outside of the chamber 8 by the rotation mechanism 54, the extended rod 95 of the support member 58 pushes up one side portion of the back support portion 44B and supports the portion 44B horizontally. The air cylinder may be replaced with a lift mechanism that combines a ball screw and a drive motor, for example. In short, the support member may be any mechanism that can push up the one side portion of the back support portion 44B and horizontally support it through up-and-down motion. In the case where the support member 58d is thus composed of the drive mechanism, it should preferably be located outside the chamber vessel 18 in order to restrain production of particles.

FIGS. 12 to 14 show a cassette chamber according to a second embodiment of the present invention. Like reference numerals refer to common components that are also used in the first embodiment, and a description of those components is omitted.

In the cassette chamber of the present embodiment, two arms 50A and 50B have the same length, and an auxiliary pedestal 42 is mounted on a main shaft 40 in parallel relation. A back support portion 44B of a cassette support 44 is attached to one side portion of the pedestal 42 by means of a hinge 68. The hinge 68 is provided with an elastic member, such as a spring, which continually urges the back support portion 44B to be separated from the pedestal 42. A bottom support portion 44A of the cassette support 44 is provided with a guide groove 70 having the shape of a circular arc around the hinge 68. The auxiliary pedestal 42 is provided with a stopper plate 42A, which is bonded to the pedestal 42 at right angles and extends in the horizontal direction. Formed on the upper surface of the stopper plate 42A is a projection 72, which is fitted in the guide groove 70. The back support portion 44B, which is separated from the auxiliary pedestal 42 by means of the urging force of the elastic member attached to the hinge 68, is restrained from being further separated from the pedestal as the projection 72 abuts against an end portion of the guide groove 70. Thereupon, a separation angle θ between the back support portion 44B and the auxiliary pedestal 42 is kept at 22.5°, for example. Thus, the back support portion 44B is oriented in an access direction A of a transportation arm 12.

A guide rod 74 is provided on one side portion or hinge-side portion of the bottom support portion 44A of the cassette support 44, and extends on the side of the main shaft 40. A rotatable guide roller 76 is mounted on the distal end of the rod 74. The roller 76 is formed of a resin in order to restrain production of particles. A chamber vessel (not shown) is provided with a guide rail member 78 having a groove in which the guide roller 76 is movably fitted, as shown in FIG. 13. In this case, an upper end portion 78A of the groove of the rail member 78 is opened so that the guide roller 76 can be disengaged upward through it.

The groove of the guide rail member 78 is vertically bent so as to be in the form of a somewhat helical circular arc. The groove regulates the movement of the guide roller 76 so that the back support portion 44B of the cassette support 44 engages the auxiliary pedestal 42 as the pedestal 42 rotates through 90° around the shaft 40. Thus, when the guide rod 74 takes a horizontal position such that the roller 76 is situated at the upper end portion 78A of the groove of the guide rail member 78, the member 78 causes the auxiliary pedestal 42 and the back support portion 44B to separate at the angle θ from each other, thereby orienting a wafer loading/unloading aperture 14 of a cassette C in the moving direction A of the transportation arm 12 (see FIG. 12). When the guide roller 76 is situated at a lower end portion 78B of the groove of the guide rail member 78, on the other hand, the member 78 causes the auxiliary pedestal 42 and the back support portion 44B to engage each other and directs the aperture 14 of the cassette C upward (see FIG. 14). With this arrangement, according to the present embodiment, the necessity of the support member 58 according to the first embodiment can be obviated.

The following is a description of the operation of the cassette chamber according to the present embodiment.

When the lift rod 34 (see FIG. 1) is lowered to a predetermined height from the state in which the projection 72 abuts against the end portion of the guide groove 70 so that the auxiliary pedestal 42 and the back support portion 44B are separated at the predetermined angle θ from each other (or in which the wafer loading/unloading aperture 14 of the cassette C is oriented in the access direction A of the transportation arm 12), pinion gears 48 and stationary racks 56 mesh with one another, as shown in FIG. 12. At this time, the guide roller 76 on the distal end of the guide rod 74 engages the upper end portion 78A of the guide rail member 78. When the lift rod 34 in this state is further moved downward to lower the lift pedestal 32 (see FIG. 1), the main shaft 40 rotates, and the auxiliary pedestal 42 and the cassette support 44 rotate so as to project outside the chamber vessel. During this rotating operation, the guide roller 76 is guided along the groove of the rail member 78. Thus, the back support portion 44B of the cassette support 44 engages the auxiliary pedestal 42, whereupon the cassette C is carried out of the chamber vessel in a horizontal state such that its wafer loading/unloading aperture 14 faces upward (see FIG. 14).

According to the cassette chamber of the present invention, as described above, the same effects of the first embodiment can be obtained, and the guide rod 74 for setting the cassette C in the horizontal position has the guide roller 76, so that the coefficient of friction between the roller 76 and the guide rail member 78 can be lowered to restrain production of particles.

FIGS. 15 to 22 show cassette chambers according to a third embodiment of the present invention.

As shown in FIG. 15, cassette chambers 118 and 120 according to the present embodiment, like the cassette chambers 8 and 10 of the cluster tool apparatus shown in FIGS. 23 and 24, are connected to a transfer chamber 6. A chamber vessel that forms each of the cassette chambers 118 and 120 has a cassette loading aperture 122 and a wafer unloading aperture 124. In this case, the apertures 122 and 124 are parallel to each other. More specifically, the cassette loading aperture 122 is directed at the predetermined angle θ (e.g., 22.5°) to the X-axis direction and parallel to the access direction A of the transportation arm 12 in the transfer chamber 6.

Since the cassette chambers 118 and 120 have substantially the same construction, only the chamber 118 will be described below.

As shown in FIG. 16, the cassette chamber 118 includes a generally rectangular chamber vessel 121 of, e.g., aluminum. The vessel 121 is provided with the cassette loading aperture 122 in one side face thereof, through which a cassette C can be passed. The aperture 122 is closed by an open-close gate door G1. The wafer unloading aperture 124 is formed in the upper part of the other side face of the vessel 121. The aperture 124 is connected to the transfer chamber 6 by means of an open-close gate valve G.

The cassette C, which is stored with semiconductor wafers W as objects of treatment, is constructed in the same manner as the ones according to the first and second embodiments, as shown in FIG. 7. The cassette C is set in a working region on the side of the cassette loading aperture 122 so as to face in the X-axis direction, having its wafer loading/unloading aperture 14 directed upward.

A lift pedestal 134 is provided in the chamber vessel 121. A lift rod 135 is connected to the underside of the pedestal 134. The rod 135 airtightly penetrates a bottom portion 121A of the vessel 121 with the aid of a seal 136, such as an O-ring, and is moved up and down by means of a lift mechanism 138.

As is clearly shown in FIG. 17, a horizontally extending auxiliary pedestal 142 is rotatably mounted on one side portion of the lift pedestal 134 by means of a main shaft 140. As is also shown in FIG. 18, an L-shaped cassette support 144 is rotatably attached to one side portion of the pedestal 142 by means of hinges 156. More specifically, the main shaft 140 is first rotatably supported on the one side portion of the lift pedestal 134 by means of two bearings 146. Pinion gears 148, which constitute part of a rotation mechanism 158 (mentioned later), are fixed individually to the opposite ends of the shaft 140. Preferably, the gears 148 are formed of a resin having relatively high hardness, in order to restrain production of particles. The auxiliary pedestal 142 is fixed to the main shaft 140 by means of screws 150. Thus, the pedestal 142 can rotate integrally with the shaft 140.

On the other hand, the L-shaped cassette support 144 is composed of a bottom support portion 152 for bearing and holding the bottom face 30 of the cassette C and a back support portion 154 for bearing and holding the back face 24 of the cassette. These two support portions 152 and 154 are bonded together at right angles to each other. The bottom support portion 152 is formed of two support plates 152A and 152B, which are coupled together by means of, for example, three height adjusting screws 157 (only two of which are shown in FIG. 16). The distance between the plates 152A and 152B can be changed to adjust the height of the cassette support 144 by turning the screws 157. In this case, the support plate 152B is attached to the one side portion of the auxiliary pedestal 142 by means of the hinges 156.

As is clearly shown in FIG. 18, two stationary racks 160 are set up vertically on the bottom portion 121A of the chamber vessel 121, in positions where they can mesh with their corresponding pinion gears 148. Preferably, the racks 160 are formed of a resin having relatively high hardness, in order to restrain production of particles.

The stationary racks 160, along with the pinion gears 148, constitute the rotation mechanism 158 for rotating the cassette support 144. The racks 160 mesh with their corresponding gears 148 that ascend and descend as the lift rod 135 moves up and down. As the gears 148 are rotated, the main shaft 140 is rotated, and the cassette support 144, which is fixed to the shaft 140 by means of the auxiliary pedestal 142, is rotated. More specifically, the racks 160 have their tooth shape and height set so that they can rotate the pinion gears 148 through 90°, and moreover, can rotate the descending and ascending gears 148 in the counterclockwise and clockwise directions of FIG. 1, respectively. Thus, when the lift pedestal 134 descends, the rotation mechanism 158 rotates the cassette support 144 through 90° in the counterclockwise direction, thereby causing it to project outward from the cassette chamber 118 through the cassette loading aperture 122. When the pedestal 134 ascends, the mechanism 158 rotates the support 144 through 90° in the clockwise direction, thereby situating it inside the chamber 118.

In order to position the cassette support 144 with respect to the lift pedestal 134, the pedestal 134 is provided with a projection 169 on its upper surface, while the auxiliary pedestal 142 has a recess 170 on its lower surface (see FIG. 16). The projection 169 can be fitted in the recess 170.

Outside the chamber vessel 121, on the other hand, an actuator 162 formed of, e.g., an air cylinder is located close to the cassette loading aperture 122, as shown in FIG. 15 and FIGS. 18 to 21. The body of the actuator 162 is fixed to the outer surface of the chamber vessel 121 by means of a support arm 164. Also, the actuator 162 has an engaging rod 166 capable of extension and contraction. As shown in the drawings, the rod 166 has a hook 166A at its distal end, which is bent upward at an angle of 90°. The hook 166A can be fitted in an engaging hole 168 (see FIG. 18) of the back support portion 154 that is rotated through 90° to the outside of the chamber 118. When the actuator 162 is actuated with the hook 166A fitted in the hole 168, the whole cassette support 144 is rotated through the predetermined angle θ around the hinges 156.

The following is a description of the operation of the cassette chamber 118 constructed in this manner.

FIGS. 15, 16 and 18 show a state in which the cassette C, holding the semiconductor wafers W therein, is located in a wafer delivery position in the upper part of the chamber vessel 121. In this state, the cassette support 144 is oriented in the access direction (moving direction) A of the transportation arm 12 (or is directed at the predetermined angle θ to the X-axis direction). Thus, the wafer loading/unloading aperture 14 of the cassette C placed on the cassette support 144 is opposed to the wafer unloading aperture 124 of the chamber vessel 121, and is also oriented in the access direction A of the arm 12 in the transfer chamber 6. In this state, moreover, the load of the cassette C is borne by the support plate 152A of the bottom support portion 152 of the cassette support 144.

In discharging the cassette C in this state from the chamber vessel 121, the lift rod 135 is first moved downward to lower the lift pedestal 134. When the pedestal 134 is lowered to a predetermined height, the pinion gears 148, fixed individually to the opposite ends of the main shaft 140, mesh with the teeth of the stationary racks 160 that are set up on the bottom portion 121A of the vessel 121. When the lift pedestal 134 is further lowered with the gears 148 and the racks 160 in mesh with one another, the gears 148 rotate in the counterclockwise direction of FIG. 16 as they descend along their corresponding racks 160. Also, the main shaft 40, which is integral with the pinion gears 148, descends rotating counterclockwise. Accordingly, the auxiliary pedestal 142, which is fixed to the shaft 40, and the cassette support 144 also descend rotating counterclockwise, whereupon the wafer loading/unloading aperture 14 of the cassette C, having so far been oriented in the horizontal direction, starts gradually to turn upward (see FIG. 19).

Figure 20:
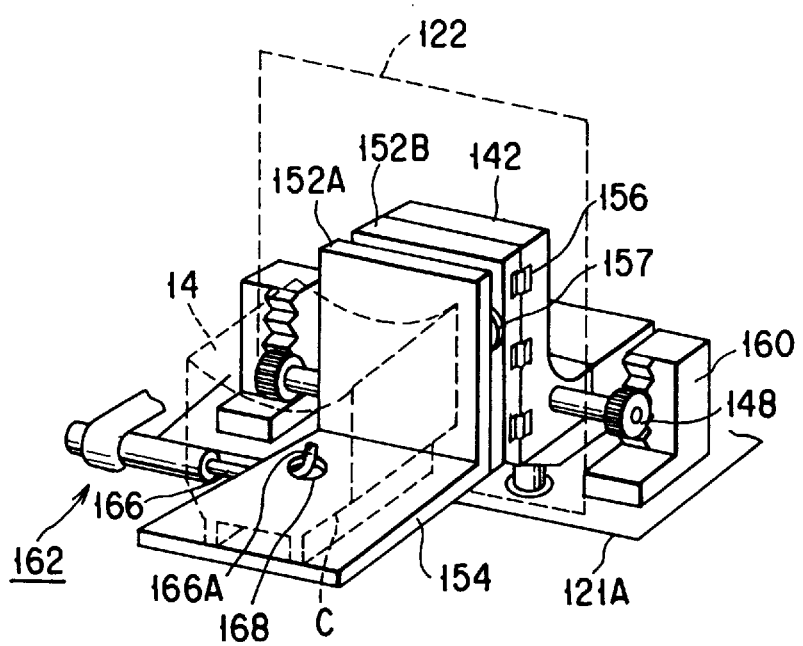
FIG. 20 is a perspective view showing the cassette rotated through 90° by means of the rotation mechanism in the cassette chamber of FIG. 16.
Figure 25:
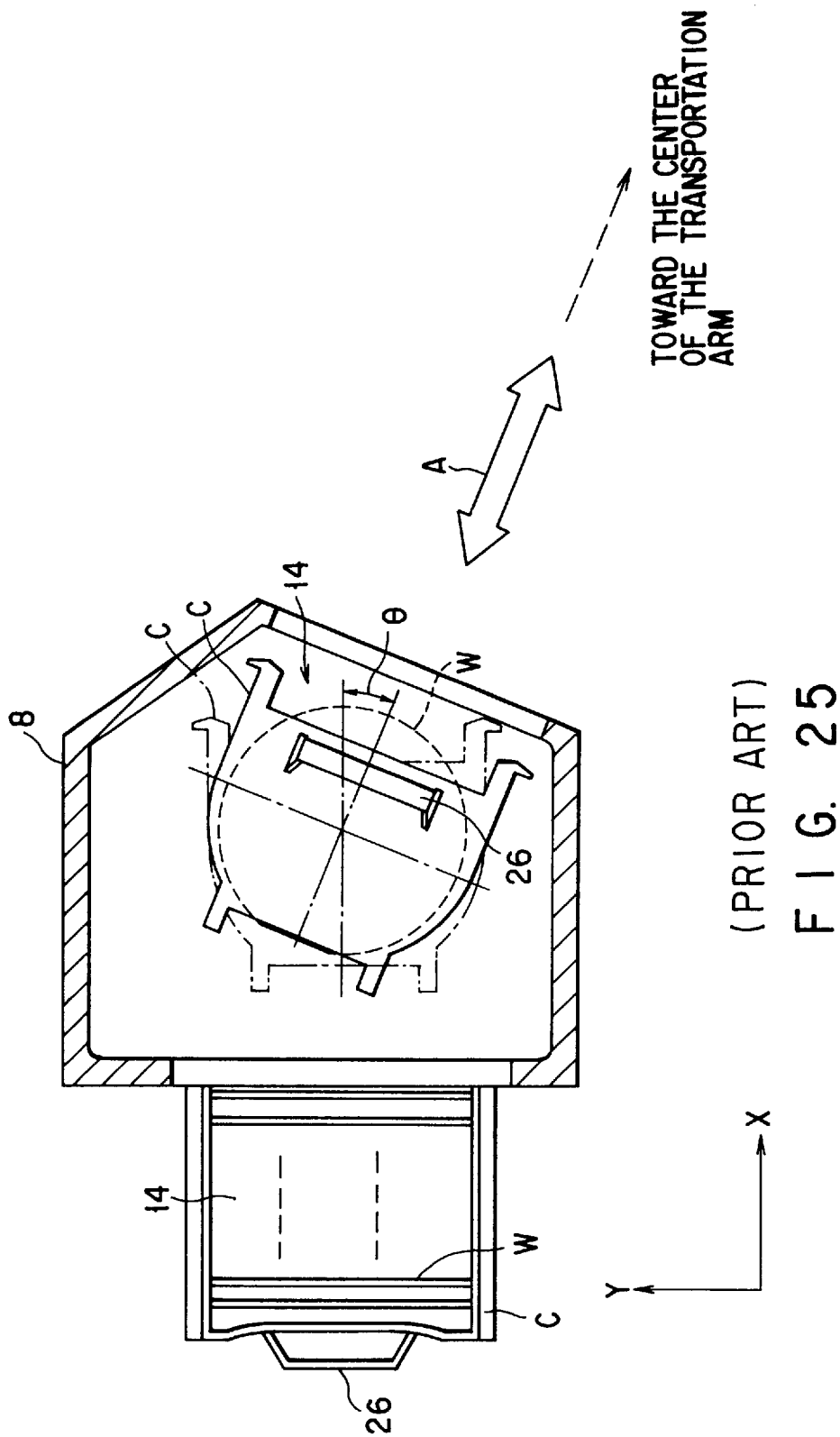
FIG. 25 is a plan view for illustrating a conventional method in which a cassette is set in a wafer delivery position.

When the cassette support 144 is rotated counterclockwise through 90° in this manner, the descent of the lift pedestal 134 is stopped, and the support 144 is stopped from rotating further. FIG. 20 shows the resulting state. As shown in FIG. 20, the back support portion 154 projects outward from the chamber vessel 121 through the cassette loading aperture 122 in a manner such that it is kept horizontal. Thus, the cassette C also projects outside the vessel 121, and its load is borne by the back support portion 154 with the wafer loading/unloading aperture 14 facing upward (in the Z-axis direction). In this state, moreover, the hook 166A of the engaging rod 166 of the actuator 162, previously held on standby in a predetermined position, is fitted into the engaging hole 168 in the back support portion 154 of the cassette support 144. When the rod 166 in this state is extended to cause the support 144 to rotate through the angle θ around the hinges 156 and separate from the auxiliary pedestal 142, as shown in FIG. 21, the cassette C is oriented in the X-axis direction. The state of the cassette C at this point of time is indicated by full line in FIG. 22

When the aforesaid operation is carried out reversely from the state shown in FIG. 21, the cassette C is loaded into the chamber vessel 121, and the wafer loading/unloading aperture 14 is oriented in the access direction A of the transportation arm 12. Thus, when anthe cassette C is placed horizontal on the back support m ember 154 of the cassette support 144 in the state shown in FIG. 21 with the aperture 14 upward, the engaging rod 166 of the actuator 162 is contracted, whereupon the support 144 is rotated through the angle θ. Thus, the bottom support portion 152 of the support 144 is caused to engage the auxiliary pedestal 142. When the lift pedestal 134 in this state is raised, the pinion gears 148 ascend along their corresponding stationary racks 160, and the main shaft 140 rotates clockwise. As a result, the cassette support 144 also rotates clockwise to be taken into the chamber vessel 121. When the pedestal 134 is further raised so that the cassette support 144 is rotated clockwise through 90°, the support 144 is held in the same posture as the one shown in FIG. 18.

According to the cassette chamber of the present embodiment, as described above, substantially same effects of the first and second embodiments can be obtained. Unlike the ones according to the first and second embodiments, the cassette chamber according to the present embodiment requires use of the actuator 162 for rotating the cassette C in the horizontal direction. Since the actuator 162 is located outside the cassette vessel 121, however, there is no possibility of produced particles adhering to the wafer surface. Also in the case of the present embodiment, the lift pedestal 134 may have a space that can store a plurality of dummy wafers for inspection, for example.

Semiconductor wafers have been described as typical objects of treatment according to the aforementioned embodiments. Alternatively, however, glass substrates, LCD substrates, etc. may be used as objects of treatment. Moreover, the apparatus to which the cassette chamber according to the present invention is applied is not limited to the so-called cluster tool apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A cassette chamber comprising:
    a housing defining a space stored with a cassette for holding a plurality of objects of treatment;
    a lift base having a rotatable shaft and located in the housing for up-and-down motion;
    an auxiliary base fixed to the shaft and inclined at a predetermined angle to the longitudinal direction of the shaft;
    a cassette support having a bottom support portion set on the lift base and bearing the bottom face of the cassette and a back support portion rotatably supported by the auxiliary base and bearing the back face of the cassette;
    a rotation mechanism for rotating the shaft as the lift base ascends or descends, thereby rotating the auxiliary base and the cassette support between a first position inside the housing and a second position outside the housing; and
    support means for keeping the back support portion of the cassette support parallel to the shaft by engaging the back support portion being rotated to the second position by the rotation mechanism and causing the back support portion to rotate relatively to the auxiliary base.

2. A cassette chamber according to claim 1, wherein said rotation mechanism is composed of a rack located in the housing and extending along the ascending or descending direction of the lift base and a pinion gear fixed to the shaft and in mesh with the rack.

3. A cassette chamber according to claim 2, wherein said rack and/or pinion gear is formed of a resin.

4. A cassette chamber according to claim 1, further comprising urging means for urging the back support portion to engage the auxiliary base.

5. A cassette chamber according to claim 1, wherein said support means is driven to advance or retreat in the direction to engage the back support portion.

6. A cassette chamber according to claim 1, wherein said support means includes a rotatable first rotating member adapted to engage the back support portion.

7. A cassette chamber according to claim 6, wherein said back support portion includes a second rotating member adapted to engage the first rotating member.

8. A cassette chamber according to claim 1, wherein said support means is located inside the housing.

9. A cassette chamber according to claim 1, wherein said support means is located outside the housing.

10. A cassette chamber comprising:
    a housing defining a space stored with a cassette for holding a plurality of objects of treatment;
    a lift base having a rotatable shaft and located in the housing for up-and-down motion;
    an auxiliary base fixed to the shaft and extending parallel to the shaft;
    a cassette support having a bottom support portion set on the lift base and bearing the bottom face of the cassette and a back support portion rotatably supported by the auxiliary base and bearing the back face of the cassette;
    a rotation mechanism for rotating the shaft as the lift base ascends or descends, thereby rotating the auxiliary base and the cassette support between a first position inside the housing and a second position outside the housing; and
    rotating means for causing the back support portion of the cassette support, being rotated to the second position by the rotation mechanism, to rotate relatively to the auxiliary base, thereby causing the back support portion to engage the auxiliary base.

11. A cassette chamber according to claim 10, wherein said rotating means includes a rod extending from the bottom support portion and guide means for guiding the distal end of the rod so that the back support portion and the auxiliary base engage each other as the lift base ascends or descends.

12. A cassette chamber according to claim 11, wherein said rod is fitted with a roller at the distal end thereof, the roller being guided by the guide means.

13. A cassette chamber according to claim 10, wherein said rotation mechanism is composed of a rack located in the housing and extending along the ascending or descending direction of the lift base and a pinion gear fixed to the shaft and in mesh with the rack.

14. A cassette chamber according to claim 13, wherein said rack and/or pinion gear is formed of a resin.

15. A cassette chamber according to claim 10, further comprising urging means for urging the back support portion to be disengaged from the auxiliary base and retaining means for maintaining a predetermined angle of separation between the back support portion and the auxiliary base.

16. A cassette chamber comprising:

a housing defining a space stored with a cassette for holding a plurality of objects of treatment;

a lift base having a rotatable shaft and located in the housing for up-and-down motion;

an auxiliary base fixed to the shaft;

a cassette support having a bottom support portion rotatably supported by the auxiliary base and bearing the bottom face of the cassette and a back support portion bearing the back face of the cassette;

a rotation mechanism for rotating the shaft as the lift base ascends or descends, thereby rotating the auxiliary base and the cassette support between a first position inside the housing and a second position outside the housing; and rotating means for causing the bottom support portion of the cassette support to rotate relatively to the auxiliary base by engaging and actuating the back support portion of the cassette support being rotated to the second position by the rotation mechanism.

17. A cassette chamber according to claim 16, wherein said rotation mechanism is composed of a rack located in the housing and extending along the ascending or descending direction of the lift base and a pinion gear fixed to the shaft and in mesh with the rack.

18. A cassette chamber according to claim 17, wherein said rack and/or pinion gear is formed of a resin.

19. A cassette chamber according to claim 16, wherein said rotating means is located outside the housing.

* * * * *